(12) United States Patent  
Chu et al.

(10) Patent No.: US 12,394,139 B2  
(45) Date of Patent: Aug. 19, 2025

(54) COMPUTER SYSTEMS AND METHODS FOR RENDERING THREE-DIMENSIONAL VIEWS USING OBJECT CACHE BUFFERING

(71) Applicant: Procore Technologies, Inc., Carpinteria, CA (US)

(72) Inventors: Winson Chu, Alameda, CA (US); Scott Bieser, Alameda, CA (US); Saipeng Wang, Hayward, CA (US)

(73) Assignee: Procore Technologies, Inc., Carpinteria, CA (US)

( * ) Notice: Subject to any disclaimer, the term of this patent is extended or adjusted under 35 U.S.C. 154(b) by 140 days.

(21) Appl. No.: 18/069,472

(22) Filed: Dec. 21, 2022

(65) Prior Publication Data

US 2024/0119658 A1 Apr. 11, 2024

Related U.S. Application Data

(60) Provisional application No. 63/414,454, filed on Oct. 7, 2022.

(51) Int. Cl.
*G06T 15/20* (2011.01)
*G06T 1/60* (2006.01)
*G06T 17/10* (2006.01)

(52) U.S. Cl.
CPC .............. *G06T 15/20* (2013.01); *G06T 1/60* (2013.01); *G06T 17/10* (2013.01)

(58) Field of Classification Search
CPC .............. G06T 19/003; G06T 2210/04; G06T 17/10; G06T 1/60; G06T 15/20; G06F 30/13; G06F 3/04815; G06Q 50/08
See application file for complete search history.

(56) References Cited

U.S. PATENT DOCUMENTS 6,741,242 B1 * 5/2004 Itoh ...................... G06F 16/986  
    707/E17.118  
9,251,548 B1 * 2/2016 Garrity ................... G06T 1/00  
(Continued)

OTHER PUBLICATIONS

Abioye, Sofiat O. et al., "Artificial Intelligence in the Construction Industry: A Review of Present Status, Opportunities and Future Challenges", Journal of Building Engineering, vol. 44, Oct. 5, 2021, 13 pages.

*Primary Examiner* — Kee M Tung  
*Assistant Examiner* — Nauman U Ahmad  
(74) *Attorney, Agent, or Firm* — Lee Sullivan Shea & Smith LLP

(57) ABSTRACT

A computing platform is configured to: initialize a three-dimensional (3D) model of a given construction project and thereby determine a first set of objects; cause a first frame of the 3D model to be displayed at an end-user device from a first viewpoint having a first view frustum; receive an indication of a command to display a second frame of the 3D model from a second viewpoint having a second view frustum; identify at least a subset of objects that are contained within the second view frustum; apply one or more object processing techniques and thereby identify one or more additional objects that are contained within the second view frustum; render, as an array of pixels, a second set of objects comprising (i) the subset of objects and (ii) the one or more additional objects; and based on the second set of objects, cause the second frame to be displayed.

20 Claims, 11 Drawing Sheets

(56) References Cited

U.S. PATENT DOCUMENTS

| | | | |
|---|---|---|---|
| 2001/0043216 A1* | 11/2001 | Hoffman | G06T 15/40 |
| | | | 345/473 |
| 2018/0108110 A1* | 4/2018 | Cuervo | G06T 15/20 |
| 2020/0200532 A1* | 6/2020 | Wells | G06F 3/0346 |
| 2022/0334707 A1* | 10/2022 | Adhvaryu | G06V 20/20 |

* cited by examiner

COMPUTER SYSTEMS AND METHODS FOR RENDERING THREE-DIMENSIONAL VIEWS USING OBJECT CACHE BUFFERING

CROSS-REFERENCE TO RELATED APPLICATIONS

This application claims priority under U.S.C. § 119(e) to U.S. Provisional Application No. 63/414,454 filed on Oct. 7, 2022 and titled "Computer Systems and Methods for Rendering Three-Dimensional Views using Object Cache Buffering," the contents of which are incorporated by reference herein in their entirety.

BACKGROUND

Construction projects are complex undertakings and involve various phases, including the creation, review, and sometimes revision, of construction project plans. In most cases, construction project plans comprise visual representations that visually communicate information about a construction project. Such visual representations may take various forms. As one example, visual representations may include two-dimensional (2D) technical drawings for a given construction project, such as an architectural drawing or a construction blueprint, in which two-dimensional line segments of the drawing represent certain physical elements of the construction project like walls and ducts. In this respect, a 2D technical drawing could be embodied either in paper form or in a computerized form, such as an image file (e.g., a PDF, JPEG, etc.).

As another example, visual representations may include three-dimensional models that represent physical elements of a given construction project, such as walls, pipes, ducts, fixtures, lighting elements, etc. In this respect, a three-dimensional (3D) model is typically embodied in a computerized form, such as in a building information model (BIM) file, with three-dimensional meshes visually representing the physical elements of the construction project (e.g., walls, pipes, ducts, fixtures, lighting elements, etc.). Specialized software is configured to access the BIM file and render a 3D representation (e.g., one or more 3D views) of the construction project from one or more perspectives, which is advantageous over 2D drawings in many ways—namely, by providing a construction professional with a more complete overview of the construction project from even a single 3D view and reducing the need to shuffle through multiple 2D drawings in order to conceptualize what the construction project entails. In addition, the specialized software allows a construction professional to navigate throughout the 3D view of the BIM file and focus on elements of interest in the construction project, such as a particular wall or duct.

OVERVIEW

As mentioned above, a three-dimensional visualization of a construction project provides construction professionals with comprehensive, easily accessible information about the construction project. In order to facilitate the creation and use of a computerized, three-dimensional model of the construction project, a team of architects, designers, and/or engineers engages in a process referred to as Building Information Modeling.

As a general matter, Building Information Modeling refers to the process of designing and maintaining a computerized representation (e.g., a BIM file) containing detailed data about physical and functional characteristics of a construction project. Specialized software tools can then access this computerized representation and process the data to visually communicate information about the construction project, including information required to construct the construction project, via a navigable, three-dimensional model of the construction project and its infrastructure.

More specifically, but still by way of example, when architects, designers, and/or engineers engage in Building Information Modeling for a specific construction project, they generally produce what is referred to as a Building Information Model (BIM) file. In essence, a BIM file is a computerized description of the individual physical elements that comprise the construction project, such as the physical structure of a building, including walls, floors, and ceilings, etc., as well as the building's infrastructure, including pipes, ducts, conduits, etc., and perhaps also physical objects that will be placed in the building, such as furniture (e.g., desks, chairs, tables), lighting fixtures, etc. This computerized description can include a vast amount of data describing the individual physical elements of the construction project and the relationships between these individual physical elements, including for instance, the relative size and shape of each element, and an indication of where each element will reside in relation to the other elements in the construction project.

BIM files can exist in one or more proprietary or open-source computer-file formats and are accessible by a range of specialized software tools. One type of specialized software tool that can access BIM files is referred to as "BIM viewer software" or simply a "BIM viewer." A BIM viewer is software that is configured to access information contained within a BIM file or a combination of BIM files for a particular construction project and then, based on the BIM file(s), cause a computing device to render a 3D view of the computerized representation of the construction project. Such a view is referred to herein as a "3D BIM view" or simply a "3D view."

In order for BIM viewer software to be able to cause a computing device to render a 3D view of the construction project, BIM files typically contain data that describes the attributes of each individual physical element (e.g., the walls, floors, ceilings, pipes, ducts, etc.) of the construction project. For instance, for an air duct designed to run across the first-floor ceiling of a building, a BIM file for the building may contain data describing how wide, how long, how high, and where, in relation to the other individual physical elements of the construction project, the duct is positioned.

There are many ways for BIM files to arrange and store data that describes the attributes of the individual physical elements of a construction project. In one specific example, BIM files may contain data that represents each individual physical component in the construction project (e.g., each pipe, each duct, each wall, etc.) as a mesh of geometric triangles (e.g., a triangular irregular network, or TIN) such that when the geometric triangles are visually stitched together by BIM viewer software, the triangles form a mesh that represents a scaled model of the individual physical component. In this respect, the BIM file may contain data that represents each triangle of a given mesh as a set of coordinates in three-dimensional space ("3D-space"). For instance, for each triangle stored in the BIM file, the BIM file may contain data describing the coordinates of each vertex of the triangle (e.g., an x-coordinate, a y-coordinate, and a z-coordinate for a first vertex of the triangle; an x-coordinate, a y-coordinate, and a z-coordinate for a second vertex of the triangle; and an x-coordinate, a y-coordinate, and a z-coordinate for a third vertex of the triangle). A given mesh may be comprised of thousands, tens of thousands, or even hundreds of thousands of individual triangles, where each triangle may have a respective set of three vertices and corresponding sets of 3D-space coordinates for those vertices. However, other ways for a BIM file to contain data that represents each individual physical component in a construction project are possible as well.

For instance, BIM files may also include data describing other attributes of the individual physical elements of the construction project that may or may not be related to the element's specific position in 3D-space. As some nonlimiting examples, this data may include data describing (i) a system or sub-system that the component is associated with (e.g., structural, plumbing, HVAC, electrical, etc.), (ii) one or more materials that the individual physical element is made of, (iii) a manufacturer associated with the element, (iv) a current location associated with the element (e.g., data indicating that the element is on a truck for delivery to the construction site, and/or once delivered, data indicating where on the construction site the delivered element resides), (v) and/or one or more identifiers associated with the element (e.g., a serial number, a part number, a model number, a tracking number, etc.), (vi) one or more object identifiers associated with the element that uniquely identify it within the overall 3D model (e.g., a globally-unique identifier (GUID), etc.), among other possibilities.

Together, these other attributes are generally referred to as metadata. BIM viewer software may utilize this metadata in various ways for rendering 3D views of the construction project. For instance, some BIM viewers may be configured to present different views based on selected metadata (e.g., displaying all meshes that represent HVAC components but hiding all meshes that represent plumbing components, and/or displaying meshes representing metal components in one color and displaying meshes representing wood components in another color, etc.). Further, BIM viewers may be configured to display certain subsets of the metadata based on user input. For example, a user may provide an input to the BIM viewer through a click or tap on a graphical user interface (GUI) portion of a 3D view displaying a given mesh, and in response, the BIM viewer may cause the 3D view to display some or all of the attributes of the physical element represented by the given mesh. Other examples are possible as well.

While BIM technology provides a notable improvement over relying solely only 2D drawings to obtain information about a construction project, it does have certain limitations. For instance, 3D models rendered using BIM technology may be cumbersome to navigate and may thus not present information as quickly as a 2D technical drawing. Further, BIM technology generally requires more computing and processing resources to render and display 3D views than traditional 2D technical drawings that are typically presented in PDF form.

To address these and other inefficiencies, Procore Technologies, Inc., who is the assignee of the present application, has been developing new software related to BIM and 3D rendering technology. As some examples, Procore Technologies has developed improved software technology for (i) interacting with 3D models of construction projects via an improved mobile viewing tool, more information about which can be found in U.S. Non-Provisional application Ser. No. 17/348,163, filed Jun. 15, 2021 and entitled "Mobile Viewer Object Statusing," (ii) navigating 3D views via an improved BIM software tool, more information about which can be found in PCT Application No. WO 2020/102113, published May 22, 2020 and entitled "Computer System and Method for Navigating Building Information Model Views," and (iii) improved navigation of BIM models, more information about which can be found in U.S. Pat. No. 11,222,475, issued Jan. 11, 2022, and titled "Computer Systems and Methods for Navigating Building Information Models in an Augmented Environment," the contents of each of which are herein incorporated by reference in their entirety.

Procore Technologies has continued to explore improvements related to BIM technology and rendering 3D views. One particular challenge with existing BIM technology is rendering 3D models in a manner that is smooth, efficient, and provides users with a sense of visual continuity and consistency when changing viewpoints within a 3D model. In general, depending on the size of a construction project (e.g., a single story home, a high rise residential complex, a skyscraper, a multi-wing hospital, etc.), a 3D model of the construction project can include a vast number of objects. Further, because the 3D models of objects within a construction projects are intended to provide very detailed information including what components (e.g., structural, infrastructural, electrical, plumbing, carpentry, fixtures, etc.) are associated with the construction project, and instructions for building and/or assembling the construction project, objects that are rendered within the 3D models generally contain a high amount of detail. For example, a portion of a 3D model that represents a given floor of an office building construction project may include detailed information representing each room on that floor, each door (including each hinge and knob on each door), each desk (including each drawer of each desk), each cabinet, each chair (including each screw and each wheel on each chair), in addition to similarly detailed mechanical, electrical, and plumbing objects relating to the given floor. Thus, it can be appreciated that a given view of the 3D model for the construction project may comprise an extremely large number of objects (e.g., thousands, hundreds of thousands, millions, or even hundreds of millions, etc.).

Typically, when a user adjusts the viewpoint within the 3D model (e.g., by panning, zooming, etc.), frames of the 3D model need to be rendered at a rate of around 30 frames per second in order to reduce user-perceivable lag or slowness during the 3D rendering. Existing technology for 3D rendering typically involves processing and rendering, for each frame, every single object that is present within a current view frustum, which is a region of the 3D model (e.g., 3D space) that is displayed on-screen from a given viewing perspective. More information about determining a view frustum can be found in U.S. Pat. No. 11,380,059, issued Jul. 5, 2022, and titled "Computer System and Methods for Optimizing Distance Calculation," the entirety of which is herein incorporated by reference. This existing approach may be adequate for achieving the 30 frames per second rendering rate in situations where the number of objects in a 3D model is small enough such that typically available computing resources (e.g., central processing unit (CPU) capability, graphics processing unit (GPU) capability, memory capability, etc.) are able to render the objects at a framerate that provides "smooth" 3D rendering without user-perceived lags.

However, in line with the discussion above, 3D models for large construction projects may be so colossally detailed that any given view frustum will typically include a number of objects that cannot be rendered at an adequate framerate as described above, which may adversely impact the user-perceived smoothness of the rendered 3D view and result in a dissatisfying user experience. For instance, when the frame rate at which objects are being rendered falls below a threshold (e.g., 30 frames per second), the user may experience lags when changing viewpoints (e.g., panning or zooming within a displayed 3D view) and/or object "dropouts" (e.g., objects disappearing from and/or flashing in and out of the 3D view) as the computing resources attempt to "catch up" with rendering all of the objects within a current view frustum.

To address these and other challenges, disclosed herein is new software technology that improves upon existing technology for rendering 3D objects. At a high level, the disclosed software technology involves (i) determining objects that are to be rendered in a 3D view based on identifying objects that are visible within a given view frustum, and (ii) using stored information about previously-rendered objects as a basis for identifying objects to render in a new frame. Advantageously, the new software technology disclosed herein reduces the overall number of objects that need to be considered by a rendering engine for each frame and thus reduces the overall processing time and power required to render 3D objects. As a result, user-perceived lags and dropouts are also reduced, thereby creating a more satisfying and efficient user experience.

Accordingly, in one aspect, disclosed herein is a method carried out by a computing platform that involves: (1) causing a first frame of a three-dimensional model of a construction project to be displayed from a first viewpoint having a first view frustum, (2) receiving an indication of a command to update the first viewpoint of the three-dimensional model to a second viewpoint, the second viewpoint having a second view frustum, (3) based on the indication of the command to update the first viewpoint, retrieving a cached set of object identifiers representing previously-rendered objects within the three-dimensional model, (4) determining a set of additional object identifiers, not included in the cached set of object identifiers, representing objects that are within the second view frustum, (5) based on (i) the cached set of object identifiers and (ii) the determined set of additional object identifiers, determining a set of objects that are visible from the second viewpoint, (6) rendering the set of objects that are visible from the second viewpoint as an array of pixels to a render buffer, each pixel in the render buffer having a respective color, thereby causing a second frame of the three-dimensional model of the construction project to be displayed from the second viewpoint, (7) rendering the set of objects that are visible from the second viewpoint as an array of pixels to an object cache buffer, each pixel in the object cache buffer having a respective object identifier, (8) determining one or more new object identifiers included in the object cache buffer that are not included in the cached set of object identifiers, and (9) updating the cached set of object identifiers representing previously-rendered objects to include the one or more new object identifiers.

In another aspect, disclosed herein is a method carried out by a computing platform that involves: (1) initializing a three-dimensional (3D) model of a given construction project and thereby determining a first set of objects within the 3D model; (2) causing a first frame of the 3D model of the given construction project to be displayed at an end-user device from a first viewpoint having a first view frustum; (3) receiving, from the end-user device, an indication of a command to display a second frame of the 3D model from a second viewpoint having a second view frustum; (4) based on the indication of the command to update the first viewpoint, identifying at least a subset of objects from the first set that are contained within the second view frustum; (5) applying one or more object processing techniques and thereby identifying one or more additional objects that are contained within the second view frustum; (6) rendering to a render buffer, as an array of pixels, a second set of objects that are to be displayed in the second frame, the second set of objects comprising (i) the subset of objects from the first set and (ii) the one or more additional objects; and (7) based on the second set of objects, causing the second frame of the 3D model of the construction project to be displayed at the end-user device from the second viewpoint.

In yet another aspect, disclosed herein is a computing platform comprising at least one network interface, at least one processor, at least one non-transitory computer-readable medium, and program instructions stored on the at least one non-transitory computer-readable medium that are executable by the at least one processors such that the computing platform is configured to carry out the functions disclosed here, including but not limited to the functions of the foregoing methods.

Further, in yet another aspect, disclosed herein is at least one non-transitory computer-readable storage medium that is provisioned with program instructions that, when executed by at least one processor, cause a computing platform to carry out the functions disclosed herein, including but not limited to the functions of the foregoing methods.

One of ordinary skill in the art will appreciate these as well as numerous other aspects in reading the following disclosure.

Figure 1:
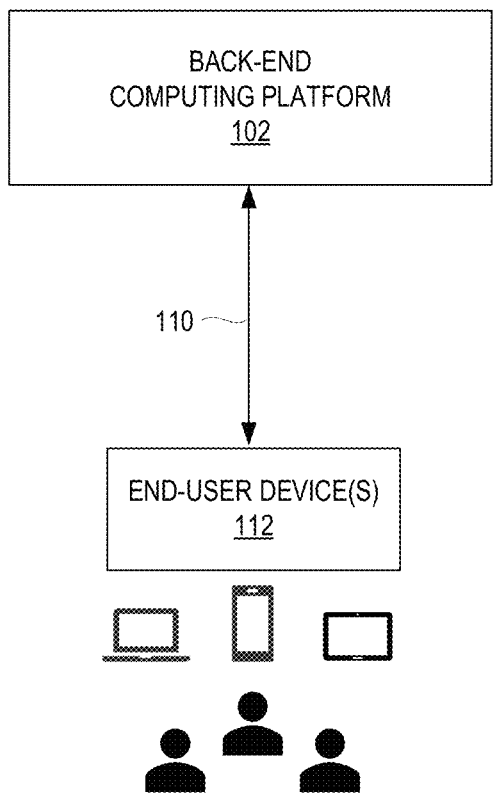
FIG. 1 depicts an example network configuration in which example embodiments disclosed herein may be implemented.

Features, aspects, and advantages of the presently disclosed technology may be better understood with regard to the following description, appended claims, and accompanying drawings, as listed below. The drawings are for the purpose of illustrating example embodiments, but those of ordinary skill in the art will understand that the technology disclosed herein is not limited to the arrangements and/or instrumentality shown in the drawings.

DETAILED DESCRIPTION

The following disclosure makes reference to the accompanying figures and several example embodiments. One of ordinary skill in the art should understand that such references are for the purpose of explanation only and are therefore not meant to be limiting. Part or all of the disclosed systems, devices, and methods may be rearranged, combined, added to, and/or removed in a variety of manners, each of which is contemplated herein.

I. EXAMPLE NETWORK CONFIGURATION

As one possible implementation, this software technology may include both front-end software running on one or more end-user devices that are accessible to users of the software technology and back-end software running on a back-end computing platform (which may also be referred to as a "cloud platform," a "data platform," a "computing platform," or a "computing system,") that interacts with and/or drives the front-end software, and which may be operated (either directly or indirectly) by a provider of the front-end client software (e.g., Procore Technologies, Inc.). As another possible implementation, this software technology may include front-end client software that runs on end-user devices without interaction with a back-end platform (e.g., a native software application, a mobile application, etc.). The software technology disclosed herein may take other forms as well.

Turning now to the figures, FIG. 1 depicts an example network configuration 100 in which example embodiments of the present disclosure may be implemented. As shown in FIG. 1, the network configuration 100 includes an example back-end computing platform 102 that may be communicatively coupled to one or more end-user devices 112.

In practice, the back-end computing platform 102 may generally comprise some set of physical computing resources (e.g., processors, data storage, communication interfaces, etc.) that are utilized to implement the new software technology discussed herein. This set of physical computing resources take any of various forms. As one possibility, the back-end computing platform 102 may comprise cloud computing resources that are supplied by a third-party provider of "on demand" cloud computing resources, such as Amazon Web Services (AWS), Amazon Lambda, Google Cloud Platform (GCP), Microsoft Azure, or the like. As another possibility, the back-end computing platform 102 may comprise "on-premises" computing resources of the organization that operates the back-end computing platform 102 (e.g., organization-owned servers). As yet another possibility, the back-end computing platform 102 may comprise a combination of cloud computing resources and on-premises computing resources. As yet another possibility, the back-end computing platform 102 may comprise one or more dedicated servers that have been provisioned with software for carrying out one or more of the functions disclosed herein. The one or more computing systems of the back-end computing platform 102 may take various other forms and be arranged in various other manners as well, including a combination of one or more of the above.

In turn, end-user devices 112 may take any of various forms, examples of which may include a desktop computer, a laptop, a netbook, a tablet, a smartphone, and/or a personal digital assistant (PDA), among other possibilities.

As further depicted in FIG. 1, the back-end computing platform 102 may be configured to communicate with each end-user device 112 over a respective communication path 110. Each communication path 110 between the back-end computing platform 102 and an end-user device 112 may generally comprise one or more communication networks and/or communications links, which may take any of various forms. For instance, each respective communication path with the back-end computing platform 102 may include any one or more of point-to-point links, Personal Area Networks (PANs), Local-Area Networks (LANs), Wide-Area Networks (WANs) such as the Internet or cellular networks, cloud networks, and/or operational technology (OT) networks, among other possibilities. Further, the communication networks and/or links that make up each respective communication path 110 may be wireless, wired, or some combination thereof, and may carry data according to any of various different communication protocols. Although not shown, each respective communication path 110 may also include one or more intermediate systems. For example, it is possible that the back-end computing platform 102 may communicate with a given end-user device 112 via one or more intermediary systems, such as a host server (not shown). Many other configurations are also possible.

Although not shown in FIG. 1, the back-end computing platform 102 may also be configured to receive data from one or more external data sources that may be used to facilitate functions related to the processes disclosed herein. For example, the back-end computing platform 102 may be configured to receive three-dimensional files and/or information about three-dimensional models for construction projects from external data sources.

It should be understood that the network configuration 100 is one example of a network configuration in which embodiments described herein may be implemented. Numerous other arrangements are possible and contemplated herein. For instance, other network configurations may include additional components not pictured and/or more or less of the pictured components.

II. EXAMPLE COMPUTING DEVICES

Figure 2:
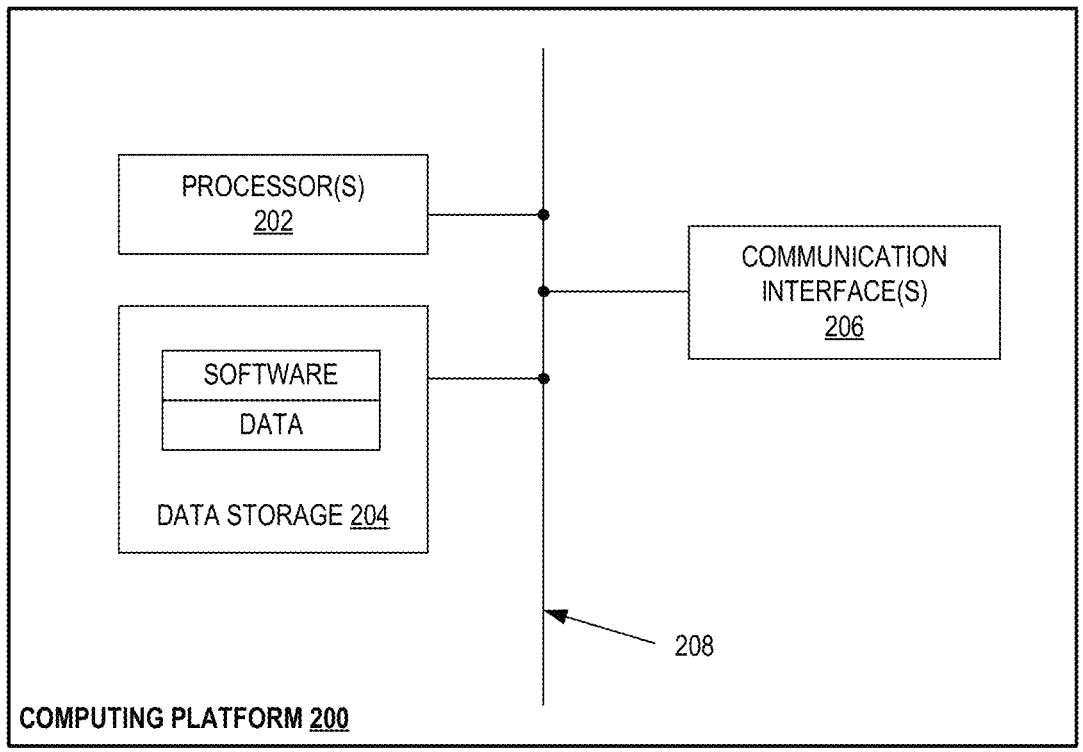
FIG. 2 depicts a structural diagram of an example computing platform that may be configured to carry out one or more functions in accordance with the disclosed technology.

FIG. 2 is a simplified block diagram illustrating some structural components that may be included in an example computing platform 200. The example computing platform 200 could serve as, for instance, the back-end computing platform 102 of FIG. 1 or the computing platform 400 of FIG. 4 (discussed further below) that may be configured to create and/or run the disclosed software technology. In line with the discussion above, the computing platform 200 may generally comprise one or more computing systems (e.g., one or more servers), and these one or more computing systems may collectively include at least one or more processors 202, a data storage 204, and one or more communication interfaces 206, all of which may be communicatively linked by a communication link 208 that may take the form of a system bus, a communication network such as a public, private, or hybrid cloud, or some other connection mechanism.

The one or more processors 202 may comprise one or more processor components, such as general-purpose processors (e.g., a single- or multi-core microprocessor), special-purpose processors (e.g., an application-specific integrated circuit or digital-signal processor), programmable logic devices (e.g., a field programmable gate array), controllers (e.g., microcontrollers), and/or any other processor components now known or later developed. In line with the discussion above, it should also be understood that the one or more processors 202 could comprise processing components that are distributed across a plurality of physical computing resources connected via a network, such as a computing cluster of a public, private, or hybrid cloud.

In turn, the data storage 204 may comprise one or more non-transitory computer-readable storage mediums that are collectively configured to store (i) program instructions that are executable by the one or more processors 202 such that the computing platform 200 is configured to perform some or all of the disclosed functions and (ii) data that may be received, derived, or otherwise stored, for example, in one or more databases, file systems, or the like, by the computing platform 200 in connection with the disclosed functions. In this respect, the one or more non-transitory computer-readable storage mediums of the data storage 204 may take various forms, examples of which may include volatile storage mediums such as random-access memory, registers, caches, buffers, etc. and non-volatile storage mediums such as read-only memory, a hard-disk drive, a solid-state drive, flash memory, an optical-storage device, etc. In line with the discussion above, it should also be understood that the data storage 204 may comprise computer-readable storage mediums that are distributed across a plurality of physical computing resources connected via a network, such as a storage cluster of a public, private, or hybrid cloud. Data storage 204 may take other forms and/or store data in other manners as well.

The one or more communication interfaces 206 may be configured to facilitate wireless and/or wired communication with external data sources and/or end-user devices, such as the end-user devices 112 in FIG. 1 (or the end-user device 300 of FIG. 3 discussed below). Additionally, in an implementation where the computing platform 200 comprises a plurality of physical computing resources connected via a network, the one or more communication interfaces 206 may be configured to facilitate wireless and/or wired communication between those physical computing resources (e.g., between computing and storage clusters in a cloud network). As such, the one or more communication interfaces 206 may take any suitable form for carrying out these functions, examples of which may include an Ethernet interface, a serial bus interface (e.g., Firewire, USB 3.0, etc.), a chipset and antenna adapted to facilitate wireless communication and/or any other interface that provides for wireless communication (e.g., Wi-Fi communication, cellular communication, short-range wireless protocols, etc.) and/or wired communication, among other possibilities. The one or more communication interfaces 206 may also include multiple communication interfaces of different types. Other configurations are possible as well.

Although not shown, the computing platform 200 may additionally include one or more interfaces that provide connectivity with external user-interface equipment (sometimes referred to as "peripherals"), such as a keyboard, a mouse or trackpad, a display screen, a touch-sensitive interface, a stylus, a virtual-reality headset, speakers, etc., which may allow for direct user interaction with the computing platform 200.

It should be understood that the computing platform 200 is one example of a computing platform that may be used with the embodiments described herein. Numerous other arrangements are possible and contemplated herein. For instance, other computing platforms may include additional components not pictured and/or more or less of the pictured components.

Figure 3:
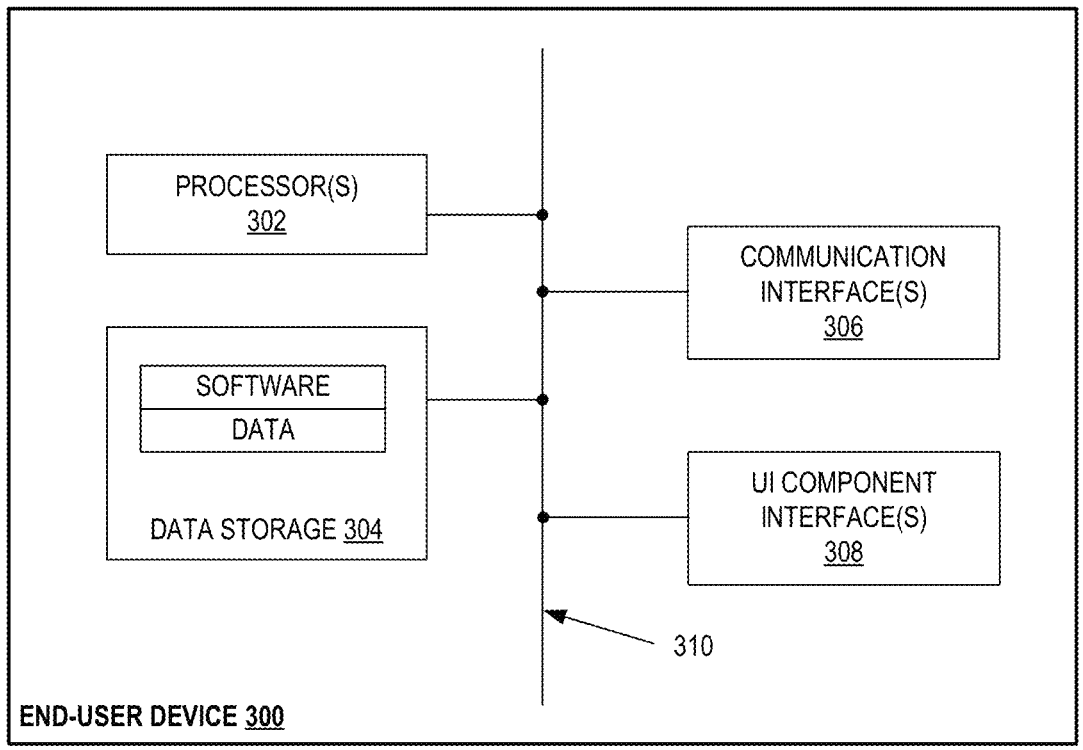
FIG. 3 depicts a structural diagram of an example end-user device that may be configured to communicate with the example computing platform of FIG. 2 and also carry out one or more functions in accordance with the disclosed technology.

Turning now to FIG. 3, a simplified block diagram is provided to illustrate some structural components that may be included in an example end-user device 300, which may serve as, for example, an end-user device 112 described above with reference to FIG. 1. As shown in FIG. 3, the end-user device 300 may include one or more processors 302, data storage 304, one or more communication interfaces 306, and one or more user-interface component interfaces 308, all of which may be communicatively linked by a communication link 310 that may take the form of a system bus or some other connection mechanism. Each of these components may take various forms.

The one or more processors 302 may comprise one or more processing components, such as general-purpose processors (e.g., a single- or a multi-core CPU), special-purpose processors (e.g., a GPU, application-specific integrated circuit, or digital-signal processor), programmable logic devices (e.g., a field programmable gate array), controllers (e.g., microcontrollers), and/or any other processor components now known or later developed.

In turn, the data storage 304 may comprise one or more non-transitory computer-readable storage mediums that are collectively configured to store (i) program instructions that are executable by the processor(s) 302 such that the end-user device 300 is configured to perform certain functions related to interacting with and accessing services provided by a computing platform, such as the example computing platform 200 described above with reference to FIG. 2, and (ii) data that may be received, derived, or otherwise stored, for example, in one or more databases, file systems, repositories, or the like, by the end-user device 300, related to interacting with and accessing the services provided by the computing platform. In this respect, the one or more non-transitory computer-readable storage mediums of the data storage 304 may take various forms, examples of which may include volatile storage mediums such as random-access memory, registers, caches, buffers, etc., and non-volatile storage mediums such as read-only memory, a hard-disk drive, a solid-state drive, flash memory, an optical-storage device etc. The data storage 304 may take other forms and/or store data in other manners as well.

The one or more communication interfaces 306 may be configured to facilitate wireless and/or wired communication with other computing devices. The one or more communication interfaces 306 may take any of various forms, examples of which may include an Ethernet interface, a serial bus interface (e.g., Firewire, USB 3.0, etc.), a chipset and antenna adapted to facilitate wireless communication, and/or any other interface that provides for any of various types of wireless communication (e.g., Wi-Fi communication, cellular communication, short-range wireless protocols, etc.) and/or wired communication. Other configurations are possible as well.

The end-user device 300 may additionally include or have interfaces for one or more user-interface components 308 that facilitate user interaction with the end-user device 300, such as a keyboard, a mouse, a trackpad, a display screen, a touch-sensitive interface, a stylus, a virtual-reality headset, and/or one or more speaker components, among other possibilities.

It should be understood that the end-user device 300 is one example of an end-user device that may be used to interact with a computing platform as described herein. Numerous other arrangements are possible and contemplated herein. For instance, in other embodiments, the end-user device 300 may include additional components not pictured and/or more or fewer of the pictured components.

III. EXAMPLE FUNCTIONALITY

As described above, Procore Technologies has continued to develop improved software technology related to 3D rendering. Disclosed herein is new software technology that is generally directed to improved techniques for rendering 3D views, which may involve identifying objects visible within a given view frustum, prioritizing rendering of those identified objects, storing information about those identified objects, and/or using information about those identified objects as a basis for rendering objects in a new frame.

In accordance with a first embodiment of the disclosed technology, objects that are to be rendered in a new frame may be obtained either from an object cache or from a 3D model of a construction project. This first embodiment and related operations will be described in more detail below with reference to FIG. 4 and FIG. 5. In accordance with a second embodiment of the disclosed technology, the object cache may be pre-populated with objects from the 3D model of the construction project, and at least some objects that are to be rendered in a new frame may be obtained from the pre-populated object cache. This second embodiment and related operations will be described in more detail below with reference to FIG. 6A, 6B and FIG. 7.

Figure 4:
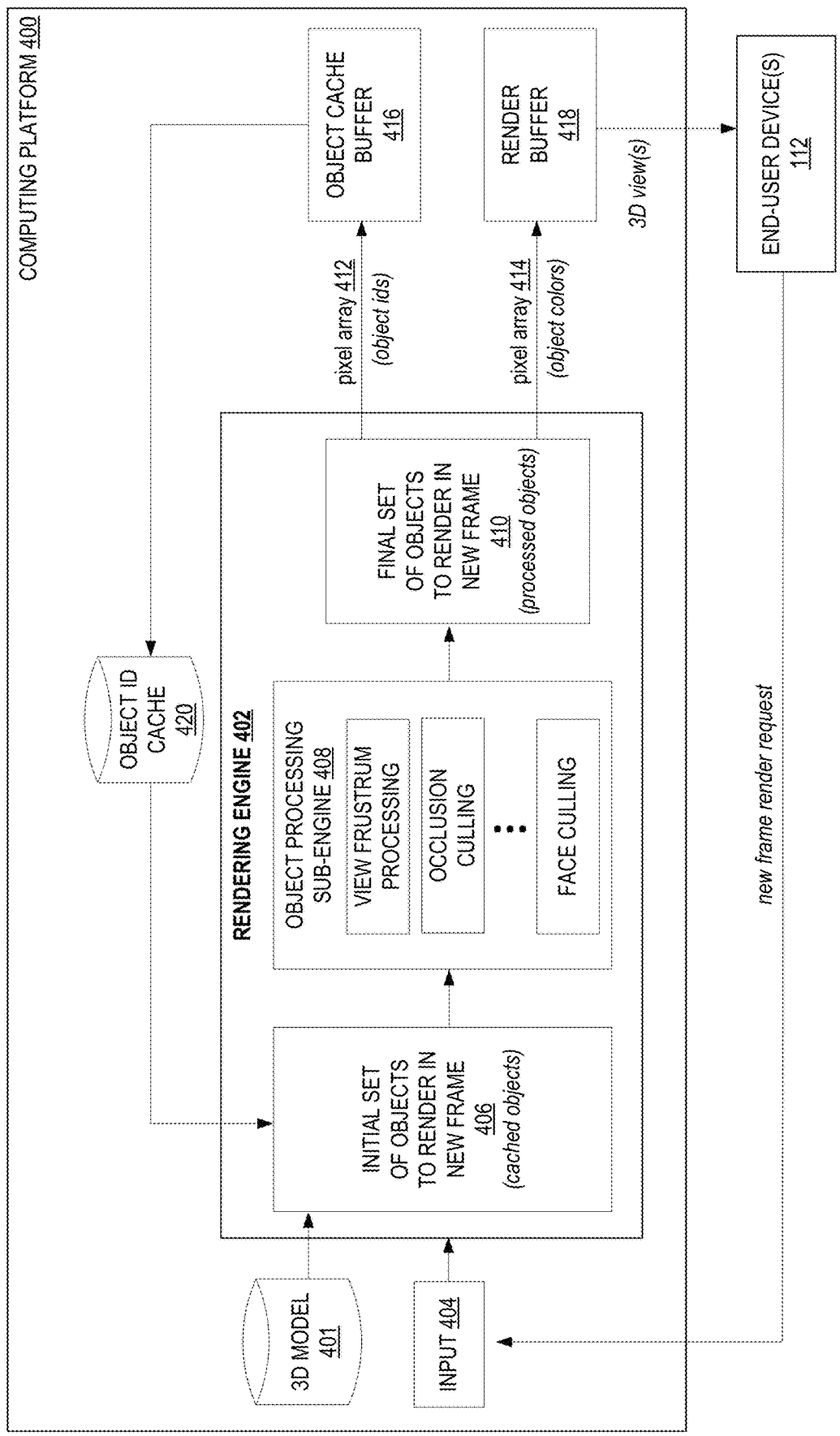
FIG. 4 depicts a simplified block diagram of an example computing platform that incorporates a rendering engine in accordance with a first embodiment of the disclosed technology.

Beginning with FIG. 4, a schematic diagram of an example computing platform 400 that is configured to perform the functions in accordance with the first embodiment disclosed herein is shown. The computing platform 400 may be similar to the back-end computing platform 102 discussed above with reference to FIG. 1 and/or the example computing platform 200 discussed above with reference to FIG. 2. The computing platform 400 may be configured to include a rendering engine 402 that functions to (i) receive, as an input 404, an indication of a request to render a new frame (e.g. an updated 3D view) of a 3D model of a construction project, (ii) identify an initial set of objects 406 that serves as input to an object processing sub-engine 408 that functions to (iii) perform one or more object processing techniques and thereby (iv) determine a final set of objects 410 that are to be rendered in the new frame. The computing platform 400 may be further configured to (v) render the objects in the final set as one or more pixel arrays, such as a first pixel array 414 that is rendered to a render buffer 418, wherein each pixel in the array 414 comprises a respective color, and/or a second array of pixels 412 that is rendered to an object cache buffer 416, wherein each pixel in the array 412 comprises a respective object identifier. Further yet, the computing platform 400 may be configured to store the object identifiers rendered to the object cache buffer 416 in an object ID cache 420.

The operations of the rendering engine 402 and the data flows depicted in FIG. 4 will now be described in more detail.

In practice, the operations of the rendering engine 402 according to the first embodiment may commence with the computing platform 400 receiving an indication of a request to render a new frame of a 3D model for a construction project. The indication of the request may be received from an end-user device, such as an end-user device 112 that is configured to communicate with the computing platform 400 and display the 3D model via an interface (e.g., a display screen) of the end-user device. For instance, a construction professional may have used the end-user device 112 to access a BIM viewer tool that is incorporated within a software application (e.g., a software as a service ("SaaS") application that comprises a front-end software component running on the end-user device and a back-end software component running on the computing platform that is accessible to the end-user device via a communication network, a native application that runs on the end-user device, etc.) that is run by the computing platform 400 and accessible to the end-user device.

As mentioned above, a view frustum comprises a region of 3D space that is displayed from a viewing perspective and contains every object in the region of 3D space that is viewable from (i.e., within view of) that viewing perspective. A given view frustum may be determined by treating an origin point of the viewing perspective as a camera and using perspective projection to identify the camera's field of view (e.g., angle of view), aspect ratio, near plane, and far plane. The area bounded by the field of view, the near plane, and the far plane of the camera is identified as the camera's view frustum. The origin point may initially be defined in various ways, such as by default (e.g., a default point within the 3D space) or based on user input that is provided via an interface of the end-user device (e.g., an indication of a given point in the 3D space that has been selected by a user via the interface of the end-user device).

The viewing perspective may be adjusted (e.g., shifted up, down, right, left, etc.) to define a different viewing perspective that has a different view frustum and thus enables viewing different angles and/or objects within the 3D model. The viewing perspective may be adjusted in various ways. As one possibility, the viewing perspective may be adjusted based on one or more user inputs that are provided via the interface of the end-user device. For instance, a user (e.g., a construction professional) may provide one or more inputs (e.g., mouse clicks, keyboard clicks, software control inputs, tap, pinch, and/or zoom touch inputs, etc.) to indicate different viewing perspectives, each having a respective view frustum that includes a respective set of objects that are viewable within that view frustum. For instance, while viewing a first 3D view (e.g., a first region of the 3D model) from a first viewing perspective, the user may pan to the left or right and/or up or down, rotate to the left or right, zoom in or out, etc., to view one or more objects within a second, a third, a fourth, etc., 3D view (e.g., a second, a third, a fourth, etc., region of the 3D model). Each such adjustment that is made to the viewing perspective may comprise a new input 404 that serves as a request to render a new frame and thereby commence the operations of the rendering engine 402 shown in FIG. 4. While FIG. 4 depicts a single input

404, in practice, the computing platform 400 may receive and process any number of inputs 404, including multiple inputs 404 per second.

After receiving the input 404, the rendering engine 402 may obtain an initial set of objects 406 that are to be rendered in the new frame. The initial set of objects 406 may comprise a list of respective object identifiers retrieved from the object ID cache 420, wherein each object identifier represents a respective object that was previously-rendered in a preceding frame. The operations by which the object ID cache 420 is populated may take various forms, which will be discussed in more detail further below. The object ID cache 420 may reside in one or more data stores of the computing platform 400. Further, the rendering engine 402 may obtain the initial set of objects 406 from the object ID cache 420 if the object ID cache 420 has at least one object identifier. In some instances, it is possible that no object identifiers may be available to obtain from the object ID cache 420. For example, in one implementation where the input 404 comprises a request to render a first frame for a 3D model, the object ID cache 420 may not contain any object identifiers to be obtained by the rendering engine 402. In such an implementation, the rendering engine 402 may obtain the initial set of objects in various other ways. For instance, as one possibility, the rendering engine 402 may obtain a pool of objects from the 3D model of the construction project, shown in FIG. 4 as 3D model 401. The pool of objects may take various forms. For example, the pool of objects may comprise every object within the 3D model 401. As another example, the pool of objects may comprise a subset of all objects within the 3D model 401. Other examples are also possible. The pool of objects may form the initial set of objects 406. The rendering engine 402 may then proceed with one or more processing and/or culling techniques that are performed by the object processing sub-engine 408 as explained below. Other examples are also possible.

Advantageously, identifying the initial set of objects 406 based on object identifiers obtained from the object ID cache 420—as opposed to starting from scratch for each new frame the process of determining which objects within the 3D model for the construction project are to be rendered for that frame—reduces the scope of objects that need to be identified for each frame, which in turn reduces the amount of processing and computational resources that are required to render objects for each frame, thereby increasing the perceived smoothness of the animation between consecutively rendered frames and providing an improved user experience.

In one implementation, the rendering engine 402 may proceed to render, in the new frame, each object in the initial set of objects 406. In another implementation, the initial set of objects 406 may be provided as input to the object processing sub-engine 408 that functions to perform one or more processing and/or culling techniques to refine the initial set of objects 406 and identify the final set of objects 410 that are to be rendered in the new frame. The one or more processing and/or culling techniques may take various forms.

As one possibility, the object processing sub-engine 408 may perform a view frustum processing technique to identify objects that are present within (e.g., viewable from the viewing perspective of) a given view frustum. More information about identifying objects within a view frustum can be found in U.S. Pat. No. 11,380,059, previously incorporated above. For instance, the object processing sub-engine 408 may perform a tree traversal technique to identify objects within the view frustum. In some implementations, the object processing sub-engine 408 may forgo affirmatively identifying any objects included within the initial set of objects and treat those objects as being present within the view frustum. After the view frustum processing is complete, the computing platform 400 may update the initial set of objects 406 to include any new objects that were identified as being viewable within the view frustum. In some instances, based on performing the view frustum processing, the object processing sub-engine 408 may determine that one or more objects from the initial set 406 are no longer present in the view frustum and/or that one or more new objects are now present in the view frustum. Therefore, the initial set of objects 406 may be updated to remove the object(s) (e.g., parts of objects) that are not present in the view frustum and/or add the new object(s) that are present in the view frustum. The object processing sub-engine 408 may additionally perform one or more other processing and/or culling techniques to further refine the set of objects that should be rendered in the second frame.

As another possibility, the object processing sub-engine 408 may perform an occlusion culling technique to identify any objects that may be contained within the view frustum but are not visible from the given viewing perspective due to being occluded by one or more other objects within the view frustum. More information about occlusion culling techniques can be found in U.S. Pat. No. 11,380,059, previously incorporated above. Thereafter, the object processing sub-engine 408 may update the initial set of objects 406 to remove those objects which are occluded from view. To illustrate with an example, after performing the view frustum processing, the object processing sub-engine 408 may identify three objects that are viewable within the view frustum. Further, after performing occlusion culling, the object processing sub-engine 408 may determine that a first object of the three objects occludes the second and third objects such that the second and third objects, while present in the given view frustum, are not visible from the given viewing perspective. Rendering the second and third objects in the new frame would be an unnecessary use of processing resources because even if rendered, those objects would not be viewable in the new frame. Therefore, the object processing sub-engine 408 may update the initial set of objects 406 to remove the second and third objects (e.g., to remove the respective object identifiers of the second and third objects). In some implementations, determining whether or not an object (or part of an object) is occluded by another object (or a part of another object) may involve querying a depth buffer to determine, for a given pixel, which object is closer to the camera within the view frustum. The object processing sub-engine 408 may additionally perform one or more other processing and/or culling techniques to further refine the set of objects that should be rendered in the second frame.

As yet another possibility, the object processing sub-engine 408 may perform a face culling technique (e.g., back-face culling) to identify, for the objects in the updated set of objects, any faces of the objects within the view frustum that may be viewable within the view frustum but are not visible from the given viewing perspective due to facing away from the given viewing perspective. More information about face culling techniques can be found in U.S. Pat. No. 11,380,059, previously incorporated above.

The processing and/or culling techniques may take other forms as well, and the object processing sub-engine 408 may additionally perform one or more other processing and/or culling techniques to further process the initial set of objects

406. Further, it should be understood that the object processing sub-engine 408 may perform any one or more processing and/or culling techniques in various ways. For example, the object processing sub-engine 408 may perform two or more techniques serially, concurrently, or a combination of the two, among other possibilities.

After the object processing sub-engine 408 has performed the one or more processing and/or culling techniques to update the initial set of objects 406 as described above, the updated set of objects may form the final set of objects 410 that are to be rendered in the new frame.

In turn, the computing platform 400 may render the objects in the final set of objects 410 to one or more buffers of the computing platform 400. In this respect, it should be understood that while the functions of identifying the final set of objects 410 and rendering one or more of those objects to a buffer are described herein as discrete steps, those functions may be performed sequentially, concurrently, or a combination of the two. For example, in some implementations, the computing platform 400 may render the objects in the final set of objects 410 as each object is identified. In such implementations, pixels corresponding to objects or parts of objects that are occluded may be overwritten by other objects that are visible from the given viewing perspective. Other examples are also possible.

The manner in which the computing platform 400 may render the objects in the final set of objects 410 to one or more buffers may take various forms. For instance, as one possibility, the computing platform 400 may render the objects in the final set 410 as a first array of pixels, wherein each pixel in the first array is associated with a respective object color for the given object in the final set 410. The first pixel array, depicted in FIG. 4 as an object color pixel array 414, may be rendered to a first buffer, shown in FIG. 4 as the render buffer 418. As shown in FIG. 4, the contents of the render buffer 418 may be used to render the final set of objects 410 in the new frame. The rendered frame may then be displayed via the interface of the end-user device 112. In turn, if a new user input to adjust the viewing perspective is provided via the interface of the end-user device, the end-user device may send an indication of that adjustment to the computing platform 400, which may take the form of a new input 404 that is provided to the rendering engine 402 for processing in line with the discussion above and then cause the end-user device 112 to display a new frame that includes objects within the respective viewing frustum of the adjusted viewing perspective.

As another possibility, the computing platform 400 may render the objects in the final set 410 as a second array of pixels, wherein each pixel in the second array is associated with a respective object identifier (e.g., a GUID) for a given object in the final set 410. The second pixel array, depicted in FIG. 4 as an object ID pixel array 412, may be rendered to a second buffer, shown in FIG. 4 as the object cache buffer 416. The object cache buffer 416 may be configured to (temporarily) store the pixel array 412 and respective object identifiers. Further, each unique object identifier in the object cache buffer 416 may be stored in the object ID cache 420. In one implementation, the object ID cache 420 may be configured to have a threshold storage capacity. In such an implementation, the object ID cache 420 may be configured such that when the storage capacity is reached, the oldest unused object identifiers are dropped from storage to make space for new object identifiers. In another implementation, the object ID cache 420 may have a storage capacity that is capable of storing object identifiers for each object in the 3D model for the construction project. The object ID cache 420 may have other storage capacities as well.

While certain operations described above have been described as being performed by the rendering engine 402, it should be understood that the operations disclosed herein may be performed by any one or more components of the computing platform 400. For instance, in one implementation, certain processing and/or culling techniques utilized by the object processing sub-engine 408, such as view frustum processing, may be performed by one or more first components of the computing platform 400 (e.g., one or more CPU components), and certain other processing and/or culling techniques utilized by the object processing sub-engine 408, such as occlusion and/or face culling, may be performed by one or more second components of the computing platform 400 (e.g., one or more GPU components). Other examples are also possible.

Advantageously, by rendering the final set of objects 410 to the object cache buffer and storing the object identifiers of rendered objects in the object ID cache for use as an initial set of objects 406 for a new frame, the disclosed approach for rendering 3D objects described in FIG. 4 significantly reduces the universe of objects that need to be newly identified for each new frame and each new view frustum, thus reducing the overall time and processing power that is spent rendering frames per second. Notably, this approach reduces user-perceived lags and dropouts that would otherwise typically occur during rendering of 3D views. Furthermore, while this disclosed approach reduces processing time and power when viewing perspectives are in motion, it enables rendering to occur continually and on a granular level when viewing perspectives are stationary. For instance, when the given viewing perspective is not in motion (e.g., the user has not made any adjustments and is not panning within a 3D view), the computing platform 400 may continue to identify and render additional objects within the given view frustum—perhaps even including those objects that are occluded—using a rendering method such as tree traversal. The additional objects may also be rendered to the object cache buffer and stored in the object ID cache 420 for later use in line with the discussion above.

Moreover, the disclosed technology provides significant value particularly for augmented reality (AR) applications where AR devices are worn by users or otherwise used while in a state of constant or near-constant motion. In the ways described above, the disclosed technology provides a notable improvement over existing techniques for continuously rendering and re-rendering 3D views.

It should be understood that FIG. 4 depicts one example of a computing platform that may be configured to carry out the functions disclosed herein. The example computing platform may take other forms as well, as will be described further below with reference to FIGS. 6A and 6B.

Figure 5:
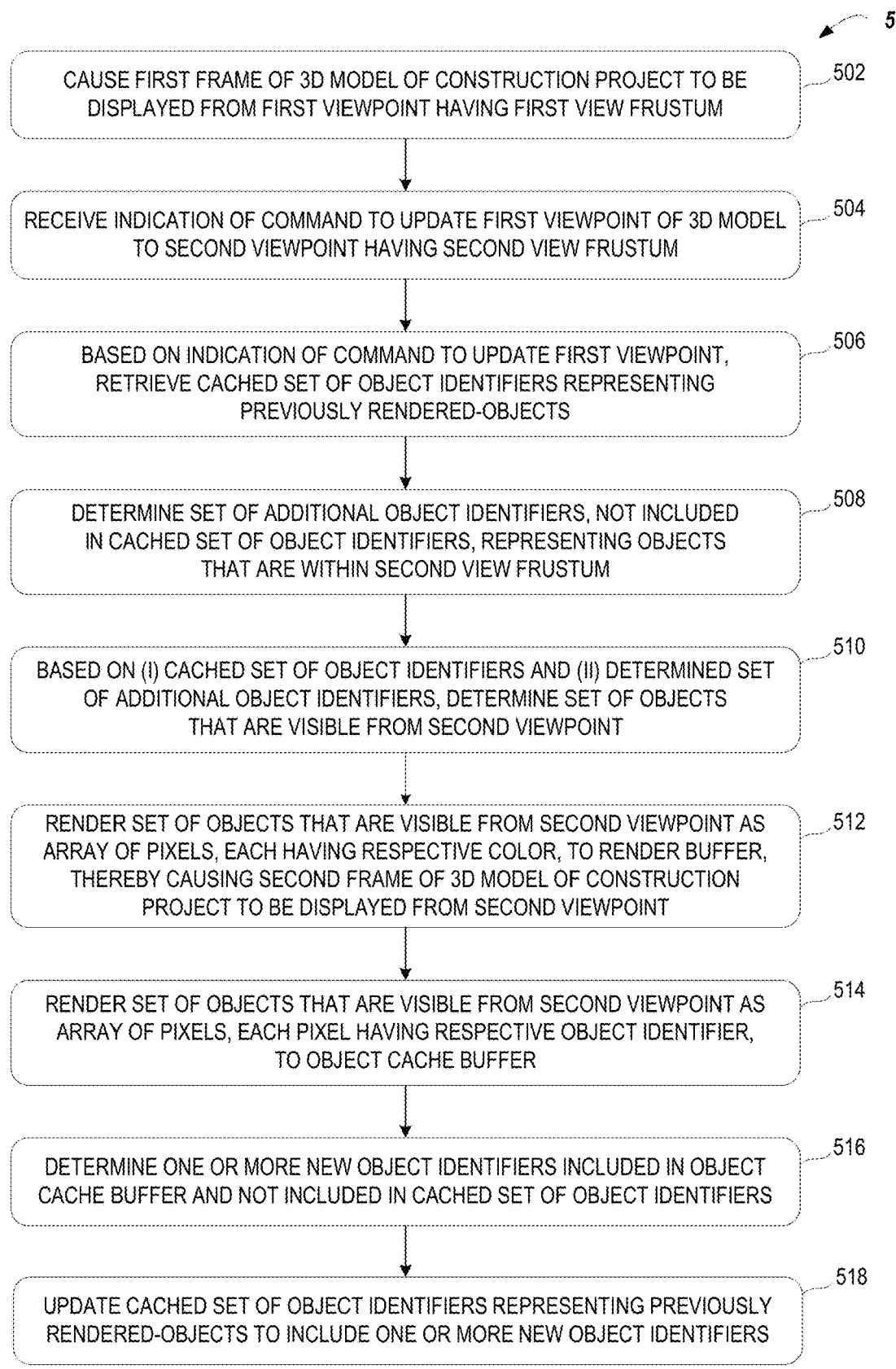
FIG. 5 depicts a flow diagram of an example process for rendering 3D views according to a first embodiment of the disclosed technology.

Turning now to FIG. 5, a flow diagram of an example process 500 for implementing the disclosed rendering techniques as described above with reference to the implementation depicted in FIG. 4 is shown. The example process 500 may include one or more operations, functions, or actions as illustrated by one or more of blocks 502-518. Although blocks 502-518 are illustrated in sequential order, these blocks may also be performed in parallel, and/or in a different order than those described herein. Also, the various blocks may be combined into fewer blocks, divided into additional blocks, and/or removed based upon the desired implementation.

In addition, for the example process 500, the flowchart shows functionality and operation of one possible implementation of embodiments described herein. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the example process 500, each block shown in FIG. 5 may represent circuitry that is wired to perform the specific logical functions in the process.

The example process 500 includes operations that may be carried out to facilitate identifying a set of objects from a 3D model of a construction project that are to be rendered in a new frame. In line with the discussion above, for the examples that follow, the example process 500 may be carried out by a back-end computing platform that is configured to run the disclosed software technology, such as the computing platform 400 shown in FIG. 4. However, it should be understood that in other implementations, the operations of the example process 500 may be carried out by a different computing device, such as an end-user device 112, or may be split between the back-end computing platform 400, an end-user device 112, and/or one or more other computing devices.

In practice, the example process 500 may be commenced while a 3D model of a construction project is being displayed at a computing device (e.g., via a user interface of an end-user device, such as the end-user device 112 shown in FIGS. 1 and 4) or in response to a request to view the 3D model of the construction project. For instance, a construction professional may have used the end-user device 112 to access a BIM viewer tool that is incorporated within a software application (e.g., a software as a service ("SaaS") application that comprises a front-end software component running on the end-user device and a back-end software component running on the computing platform that is accessible to the end-user device via a communication network, a native application that runs on the end-user device, etc.) that is run by the computing platform 400 and accessible to the end-user device.

The example process 500 may begin at block 502, where the computing platform 400 may cause the end-user device to display a first frame of the 3D model from a first viewing perspective that has a first view frustum. As mentioned above, a view frustum comprises a region of 3D space that is displayed from a given viewing perspective and contains every object in the region of 3D space that is potentially visible from the given viewing perspective. Further, in line with the discussion above, the first viewing perspective may be defined in various ways, such as being set at a default viewing perspective by the computing platform 400, or being defined based on user input provided at the end-user device, among other possibilities.

At block 504, the computing platform 400 may receive an indication of a command to update the first viewing perspective to a second viewing perspective that has a second view frustum. For instance, in line with the discussion above, the construction professional may have provided one or more inputs (e.g., mouse clicks, keyboard clicks, software control inputs, tap, pinch, and/or zoom touch inputs, etc.) to indicate the second viewing perspective. In line with the discussion above, the indication of the command may comprise the input 404 that is provided to the rendering engine 402.

In turn, at block 506, the computing platform 400 may retrieve a cached set of one or more object identifiers that represent previously-rendered objects. For instance, in line with the discussion above, the rendering engine 402 of the computing platform 400 may obtain the initial set of objects 406 from the object ID cache 420 that is to be provided to the object processing sub-engine 408 for processing.

At block 508, the computing platform 400 may determine a set of additional object identifiers that (i) represent objects within the second view frustum and (ii) are not included in the cached set of object identifiers. For instance, in line with the discussion above, the object processing sub-engine 408 may perform view frustum processing to identify objects within the second view frustum, which may include identifying any new objects that are not included in the initial set of objects 406 and/or objects from the initial set 406 that are not included in the second view frustum. The computing platform 400 may update the initial set of objects 406 to include the additional object identifiers for the objects that were determined to be within the second view frustum.

At block 510, the computing platform 400 may determine, based on the cached set of object identifiers and the additional set of object identifiers, a set of objects that are visible from the second viewing perspective. For instance, in line with the discussion above, the object processing sub-engine 408 may perform occlusion culling to identify, from the updated initial set of objects 406, those objects that are not only viewable within the second view frustum but also visible from the second viewing perspective. The object processing sub-engine 408 may further update the initial set of objects 406 to include only those objects that are visible from the second viewing perspective and determine those objects as the final set of objects 410 that are to be rendered.

At block 512, the computing platform 400 may render the set of objects that are visible from the second viewing perspective to a render buffer as an array of pixels that each has a respective color, thereby causing a second frame of the 3D model of the construction project to be displayed from the second viewing perspective. For instance, in line with the discussion above, the computing platform 400 may render the final set of objects 410 as the object color pixel array 414 to the render buffer 418 and thereby cause the second frame of the 3D model to be displayed via an interface of the end-user device 112.

At block 514, the computing platform 400 may render the set of objects that are visible from the second viewing perspective to an object cache buffer as an array of pixels that each has a respective object identifier. For instance, in line with the discussion above, the computing platform 400 may render the final set of objects 410 as the object id pixel array 412 to the object cache buffer 416.

At block 516, the computing platform 400 may determine one or more new object identifiers that are included in the object cache buffer and not included in the cached set of object identifiers. For instance, in line with the discussion above, the computing platform 400 may compare the object identifiers included in the object cache buffer 416 with the object identifiers stored in the object ID cache 420 to identify any new object identifiers that are not stored in the object ID cache 420.

At block 518, the computing platform may update the cached set of object identifiers representing previously-rendered objects to include the one or more new object identifiers. For instance, in line with the discussion above, the computing platform 400 may cause the new object identifiers that were included in the object cache buffer 416 but not the object ID cache 420 to be stored in the object ID cache 420. In turn, those new object identifiers, along with any previously-stored object identifiers, may serve as a new initial set of objects 406 during a new iteration of the example process 500/example data flows shown in FIG. 4.

It should be understood that the example process 500 depicts one example implementation of the embodiments disclosed herein.

Figure 6A:
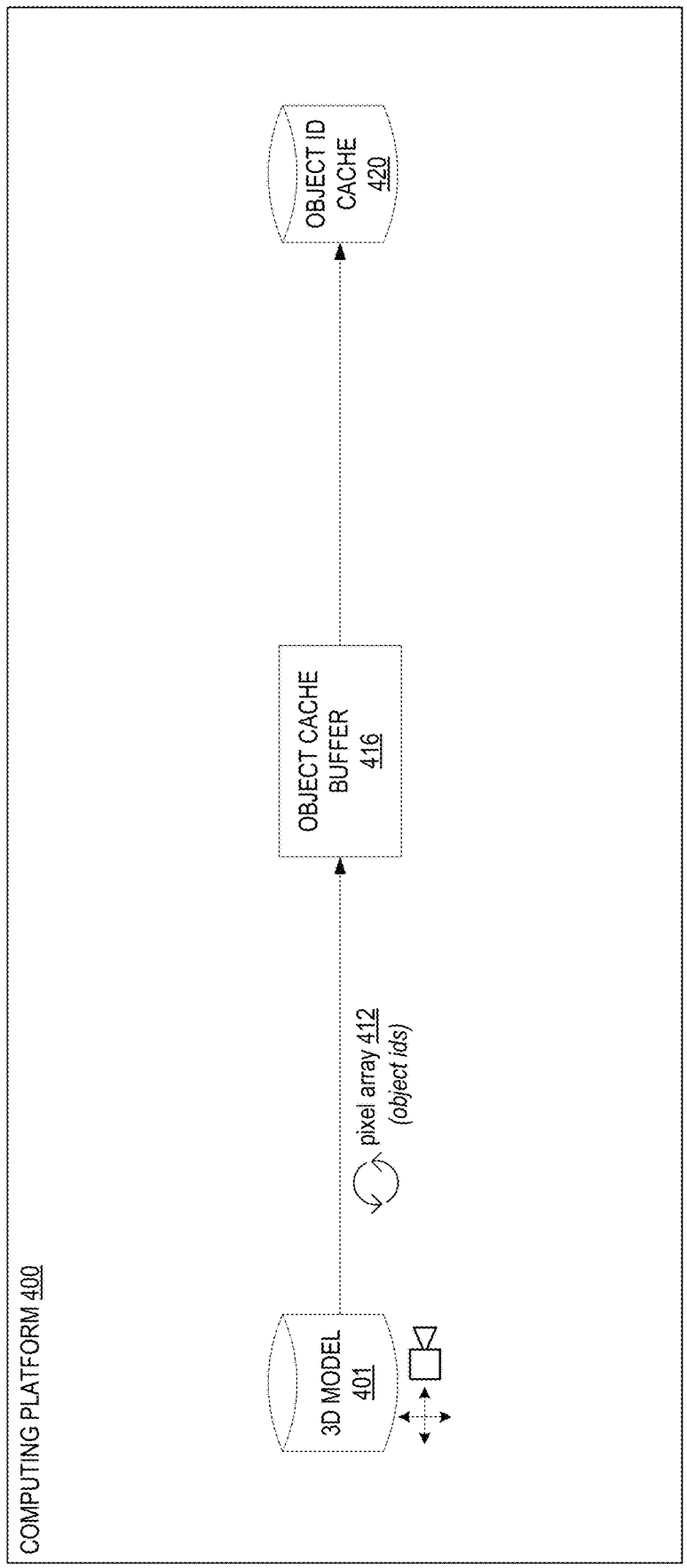
FIG. 6A depicts a simplified block diagram of an example computing platform that incorporates a rendering engine in accordance with a second embodiment of the disclosed technology.
Figure 6B:
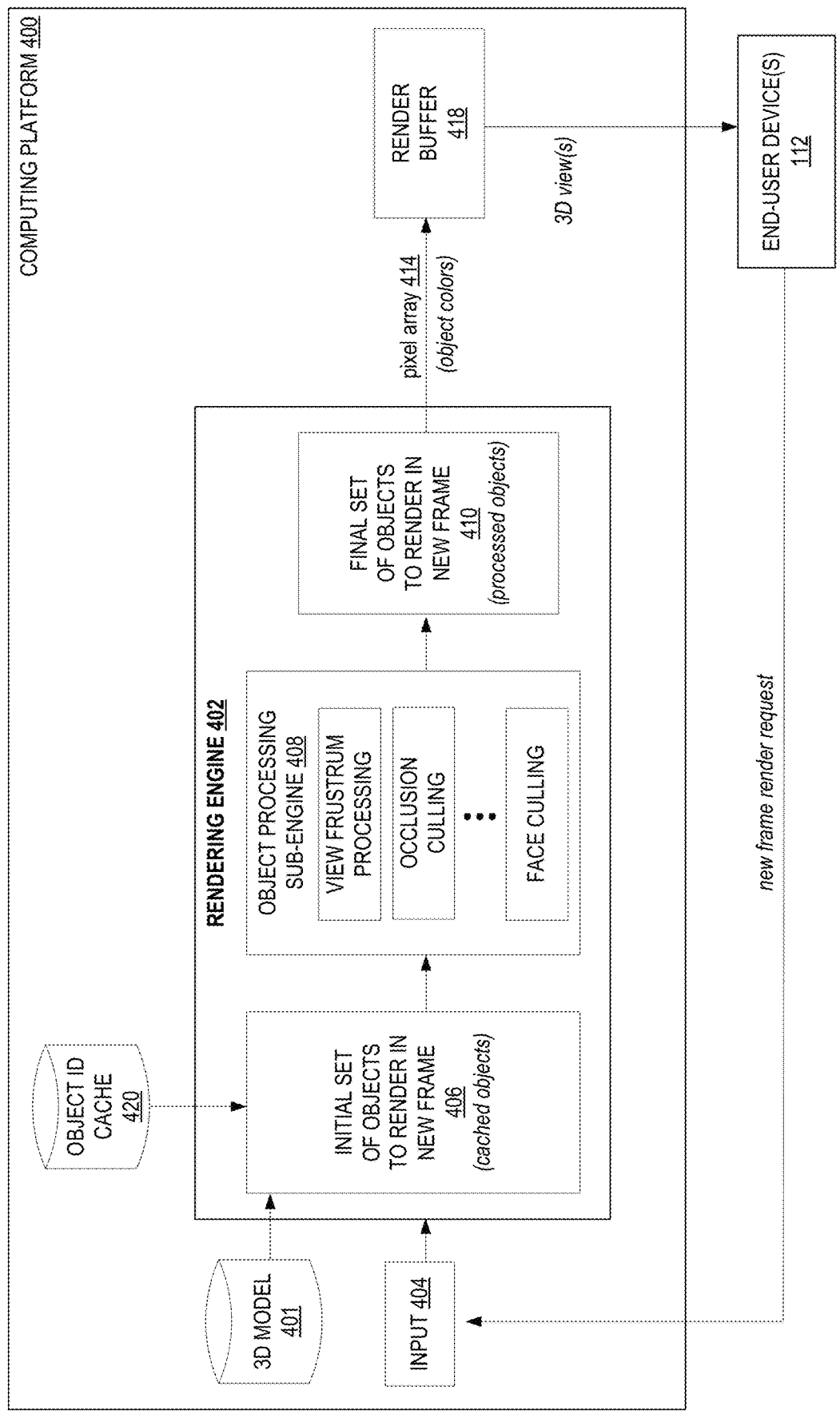
FIG. 6B depicts another simplified block diagram of the example computing platform of FIG. 6A.

With reference now to FIGS. 6A and 6B, schematic diagrams of the example computing platform 400 that is configured to perform the functions in accordance with the second embodiment disclosed herein are shown. Like in the first embodiment shown in FIG. 4, in this second embodiment shown in FIGS. 6A and 6B, the computing platform 400 is configured to include the rendering engine 402 that functions to (i) receive, as an input 404, an indication of a request to render a new frame (e.g. an updated 3D view) of a 3D model of a construction project, (ii) identify an initial set of objects 406 that serves as input to an object processing sub-engine 408 that functions to (iii) perform one or more object processing techniques and thereby (iv) determine a final set of objects 410 that are to be rendered in the new frame. Further, like in the first embodiment, in this second embodiment, the computing platform 400 is configured to store object identifiers rendered to the object cache buffer 416 in the object ID cache 420. Further yet, like in the first embodiment, in this second embodiment, the computing platform 400 is configured to render the objects in the final set of objects 410 as the pixel array 414 that is rendered to the render buffer 418.

However, unlike in the first embodiment, in this second embodiment, the final set of objects 410 are not rendered to an object cache buffer as a second pixel array for each new frame, as can be seen in FIG. 6B. Rather, the computing platform 400 is configured to render objects from the 3D model 401 to the object cache buffer 416 as the second pixel array 412, wherein each pixel in the second array 412 is associated with a respective object identifier for a given object in the 3D model 401, as an initial step before any frames are rendered, as generally shown in FIG. 6A.

According to the second embodiment, the computing platform 400 may render objects from the 3D model 401 to the object cache buffer 416 as the second pixel array 412 in various ways. For instance, according to one implementation, the computing platform 400 may render objects from the 3D model 401 to the object cache buffer 416 as the second pixel array 412 prior to receiving a first input 404. In this regard, the computing platform may render objects in the 3D model 401 to the object cache buffer 416 as the second pixel array 412, where each pixel has a respective object identifier, when the 3D model 401 is initialized (e.g., when the data for the 3D model is loaded by the computing platform 400).

Rendering objects to the object cache buffer 416 and populating the object ID cache 420 during initialization of the 3D model 401 may take various forms. As one possibility, the computing platform 400 may identify a plurality of initialization viewing perspectives (e.g., four initialization viewing perspectives, ten initialization viewing perspectives, etc.) of the 3D model 401 and for each initialization viewing perspective (each having a respective view frustum), render a set of objects that are visible from that initialization viewing perspective as a respective pixel array 412 that is rendered to the object cache buffer 416. The object cache buffer 416 may be configured to (temporarily) store each respective pixel array 412 and its respective object identifiers. Further, each unique object identifier in the object cache buffer 416 may be stored in the object ID cache 420. The object identifiers stored in the object ID cache 420 may then form at least some or all of the initial set of objects 406 that are to be rendered in a new frame.

The computing platform 400 may perform this initialization process of rendering objects from the 3D model 401 to the object cache buffer 416 any number of times (e.g., from any number of initialization viewing perspectives around the model) in order to identify objects in the 3D model 401, as shown in FIG. 6A. The object ID cache 420 may be updated with new unique object identifiers with each round of rendering that is performed as described above. Other examples of rendering objects from the 3D model 401 to the object cache buffer 416 are also possible.

In some implementations, if new objects are added to the 3D model 401 after it has been initialized, the computing platform 400 may be configured to re-initialize the 3D model 401 to capture object identifiers for any new objects that are visible from one of the initialization viewing perspectives and then cause the new object identifiers to be stored in the object ID cache 420 as described above.

As mentioned above, in practice, the computing platform 400 may initialize the 3D model 401 and thereby cause object identifiers of the objects within the 3D model 401 to be stored in the object ID cache 420 prior to receiving an input 404, which may occur at various times. For example, the 3D BIM file for the 3D model 401 may be obtained by the computing platform 400 (e.g., by way of a construction professional uploading the 3D BIM file to a data store accessible by the computing platform 400, by way of receiving the 3D BIM file from a third-party computing platform, etc.). In turn, the computing platform 400 may initialize the 3D model 401 in preparation for rendering a 3D representation of the 3D model 401 as described above.

After the computing platform 400 has completed initializing, the rendering engine 402 may receive an input 404 as described above with reference to FIG. 4. In response, the rendering engine 402 may obtain the initial set of objects 406, which may comprise a list of objects retrieved from the object ID cache 420, as shown in FIG. 6B. In turn, the initial set of objects 406 may be provided as input to the object processing sub-engine 408 that functions to perform one or more processing and/or culling techniques to refine the initial set of objects 406 and identify the final set of objects 410 that are to be rendered in the new frame. The one or more processing and/or culling techniques may take various forms, including those described above with reference to FIG. 4.

For example, as one possibility, the object processing sub-engine 408 may perform a view frustum processing technique to identify objects that are present within a view frustum for the new frame (which may be indicated by the input 404 provided by an end-user device 112 as mentioned above). In some cases, this may involve the object processing sub-engine 408 identifying one or more objects within the 3D model 401 that were not identified within the initial set of objects 406 obtained from the object ID cache 420

(e.g., one or more objects not identified during the initialization discussed above). Further, based on performing the view frustum processing, the object processing sub-engine 408 may determine that one or more objects from the initial set 406 are not present in the view frustum. Therefore, the initial set of objects 406 may be updated to add the previously unidentified object(s) that are present in the view frustum and/or remove the object(s) that are not present in the view frustum.

The object processing sub-engine 408 may additionally perform one or more other processing and/or culling techniques to further refine the set of objects that should be rendered in the frame. As one possibility, the object processing sub-engine 408 may perform an occlusion culling technique to identify any objects that may be present within the view frustum but are not visible from the viewing perspective of the view frustum due to being occluded by one or more other objects within the view frustum. As another possibility, the object processing sub-engine 408 may perform a face culling technique (e.g., back-face culling) to identify any faces of the objects within the view frustum that may not be visible from the viewing perspective of the view frustum. The processing and/or culling techniques may take other forms as well, and the object processing sub-engine 408 may additionally perform one or more other processing and/or culling techniques on the initial set of objects 406 as well.

After the objects in the initial set of objects 406 have been processed and/or culled, the remaining objects may form the final set of objects 410. In turn, the computing platform 400 may render the objects in the final set 410 to the render buffer 418 in the form of the pixel array 414, wherein each pixel in the pixel array 414 is associated with a respective color for a given object that is to be rendered in the new frame. Based on the objects rendered to the render buffer 418, the computing platform 400 may render the new frame for display at the end-user device 112.

The computing platform 400 may take other forms as well.

Like the first implementation discussed above in conjunction with FIGS. 4-5, identifying the initial set of objects 406 based on object identifiers obtained from the object ID cache 420—as opposed to starting from scratch for each new frame the process of determining which objects within the 3D model for the construction project are to be rendered for that frame—reduces the scope of objects that need to be identified for each frame, which in turn reduces the amount of processing and computing resources that are required to render objects for each frame, thereby increasing the perceived smoothness of the animation between consecutively rendered frames and providing an improved user experience.

In addition, by populating the object ID cache 420 during initialization of the 3D model 401, prior to receiving any inputs 404, the computing platform 400 may be able to conserve computing and processing resources at the time of rendering new frames in response to receiving inputs 404 by forgoing the need to render objects to the object cache buffer 416 and updating the object ID cache 420 for each new frame, and instead prioritizing rendering objects to the render buffer 418 for display at the end-user device 112. As a tradeoff, any objects that are not identified and added to the object ID cache 420 during initialization must be re-identified by the rendering engine 402 with each new frame.

Figure 7:
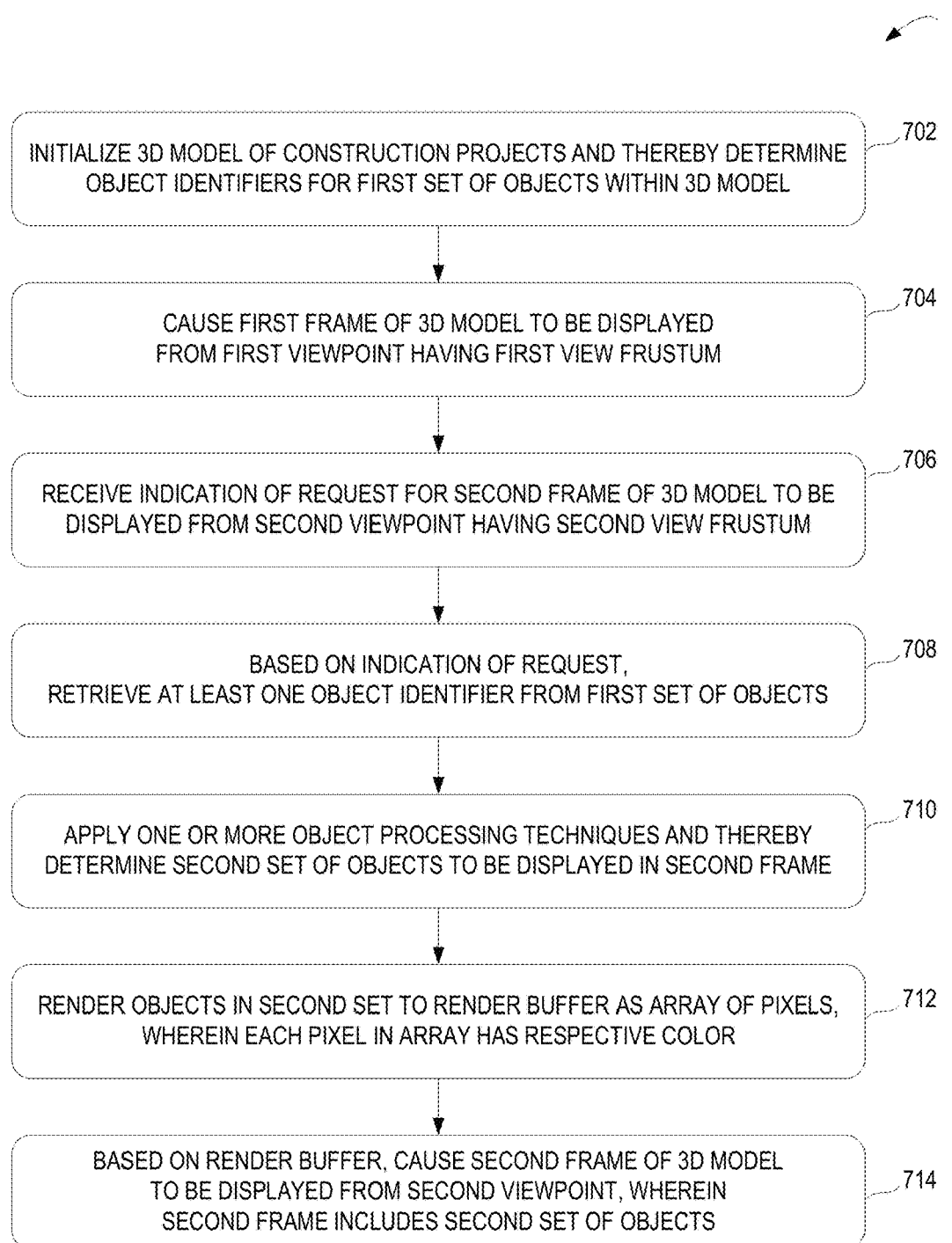
FIG. 7 depicts a flow diagram of an example process for rendering 3D views according to a second embodiment of the disclosed technology.

Turning now to FIG. 7, a flow diagram of an example process 700 for implementing the disclosed rendering techniques as described above with reference to the second embodiment depicted in FIGS. 6A and 6B is shown. The example process 700 may include one or more operations, functions, or actions as illustrated by one or more of blocks 702-714. Although blocks 702-714 are illustrated in sequential order, these blocks may also be performed in parallel, and/or in a different order than those described herein. Also, the various blocks may be combined into fewer blocks, divided into additional blocks, and/or removed based upon the desired implementation.

In addition, for the example process 700, the flowchart shows functionality and operation of one possible implementation of embodiments described herein. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the example process 700, each block shown in FIG. 7 may represent circuitry that is wired to perform the specific logical functions in the process.

The example process 700 includes operations that may be carried out to facilitate identifying a set of objects from a 3D model of a construction project that are to be rendered in a new frame of a visualization of the 3D model. In line with the discussion above, for the examples that follow, the example process 700 may be carried out by a back-end computing platform that is configured to run the disclosed software technology, such as the computing platform 400 shown in FIG. 4, FIG. 6A, or FIG. 6B. However, it should be understood that in other implementations, the operations of the example process 700 may be carried out by a different computing device, such as an end-user device 112, or may be split between the back-end computing platform 400, an end-user device 112, and/or one or more other computing devices.

In practice, the example process 700 may be commenced after a 3D model of a construction project is obtained by the computing platform 400. For instance, in one example, the computing platform 400 may retrieve a 3D BIM file for the 3D model from one or more data stores accessible to the computing platform 400. The example process 700 may begin at block 702, where the computing platform 400 may initialize the 3D model and thereby determine a respective object identifier for a set of objects in the 3D model. As described above, this function may involve identifying a plurality of initialization viewing perspectives (each having a respective view frustum) of the 3D model and for each initialization viewing perspective, rendering to the object cache buffer, as a respective pixel array, a set of objects that are visible from that initialization viewing perspective. Each unique object identifier may be rendered to the object cache buffer 416 and eventually stored in the object ID cache 420.

After the 3D model has been initialized, at block 704, the computing platform 400 may cause a first frame of the 3D model of the construction project to be displayed from a first viewpoint having a first view frustum. In practice, the computing platform 400 may receive a request from an end-user device associated with a construction professional to view the 3D model via an interface displayed at the end-user device. The first frame that is displayed at the end-user device may be determined in various ways, including those previously discussed above.

At block 706, the computing platform 400 may receive an indication of a request for a second frame of the 3D model to be displayed from a second viewpoint having a second view frustum. For instance, as discussed above, the construction professional may adjust the first viewing perspective via the interface of the end-user device, and the indication of the adjustment may be provided as an input 404 to the rendering engine 402 in line with the discussion above with reference to FIG. 6B.

At block 708, based on the indication of the request, the computing platform 400 may retrieve the object identifiers that were identified at block 702. The object identifiers may be retrieved from the object ID cache 420 and may form the initial set of objects 406. At block 710, the computing platform 400 may apply one or more object processing techniques and thereby identify a set of objects that are to be rendered in the second frame. For instance, in line with the discussion above, the rendering engine 402 may provide the initial set of objects 406 as input to the object processing sub-engine 408 that functions to perform one or more view object processing and/or culling techniques—such as frustum processing, occlusion culling, face culling, etc. as described above—to determine the final set of objects 410 that are to be rendered to the render buffer 418 for display at the end-user device.

At block 712, the computing platform 400 may render the objects in the final set of objects 410 to the render buffer as an array of pixels, where each pixel in the array comprises a respective color. In turn, at block 714, based on the render buffer 418, the computing platform 400 may cause the second frame of the 3D model to be displayed from the second viewpoint. For instance, the computing platform 400 may cause the objects that were rendered to the object buffer 418 at block 712 to be displayed at the end-user device.

The computing platform may repeat the functions described at blocks 706-714 for each new frame render request that is received by the computing platform 400 as the construction professional navigates the 3D model displayed at the end-user device.

Advantageously, by initializing a 3D model of a construction project and caching object identifiers for all objects within the 3D model prior to receiving a user request to display a frame of the 3D model in accordance with the second embodiment of the disclosed techniques as described above, computational and processing demands that would otherwise be required from a computing platform during frame rendering of the 3D model at an end-user device are significantly reduced, and user-perceived lags and dropouts in the display of the 3D model are reduced, thereby creating a more satisfactory user experience.

Figure 8C:
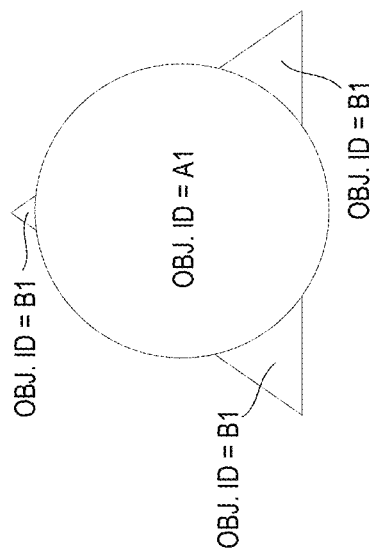
FIG. 8C depicts a schematic example of the objects of FIG. 8A rendered to an object cache buffer, according to an example implementation
Figure 8B:
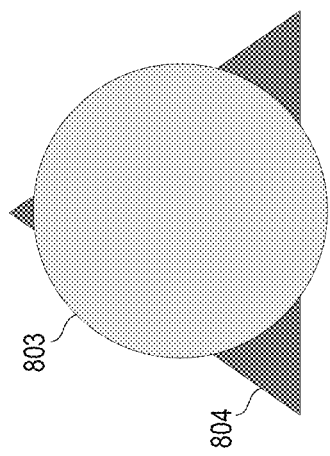
FIG. 8B depicts a schematic example of the objects of FIG. 8A rendered to a render buffer, according to an example implementation.
Figure 8A:
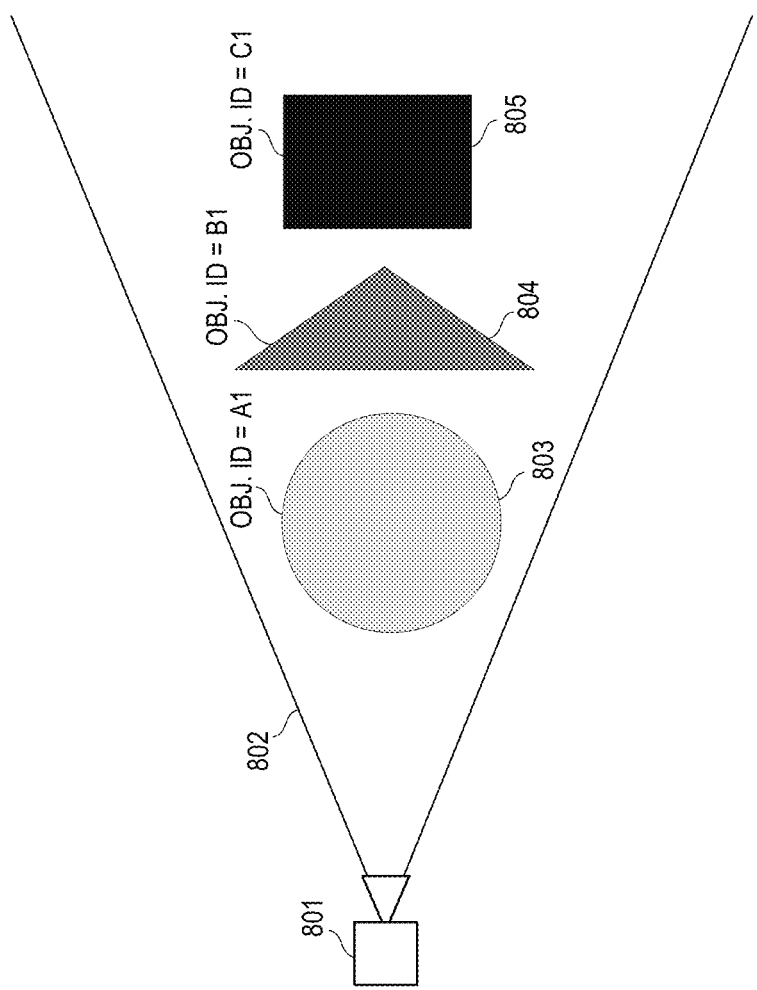
FIG. 8A depicts a schematic example of view frustum within a 3D model and an example set of objects that may be viewable within the view frustum.

Turning now to FIGS. 8A-8C, a simplified example is depicted that serves to illustrate rendering to a render buffer and an object cache buffer, as discussed above with reference to the render buffer 418 and the object cache buffer 416 shown in FIGS. 4 and 6B. With reference to FIGS. 8A-8C and FIGS. 9A-9C, it will be appreciated that a relatively small number of simplified shapes are being used for purposes of illustration only. In practice, a 3D model for a construction project is likely to include substantially more objects (e.g., hundreds of thousands, millions, etc.) that are each substantially more complex.

As shown in FIG. 8A, a set of objects is shown including a light gray object 803 having an object identifier of A1, a dark gray object 804 having an object identifier of B1, and a black object 805 having an object identifier of C1, each of which may represent a respective object within a 3D model for a given construction project. A viewing perspective is represented by a camera 801 having a conical view frustum 802. In this regard, it should be understood that the camera 801 is used to represent a particular viewing perspective, having a particular view frustum, for purposes of illustration and explanation of the examples discussed herein and illustrated in FIGS. 8A-8C and 9A-9C. In the examples discussed and contemplated herein, an actual camera need not be present.

In line with the discussion above, a rendering engine of a computing platform, such as the rendering engine 402 of the computing platform 400 shown in FIG. 4 and FIG. 6, may perform one or more operations to determine a set of objects that are visible from the viewing perspective shown in FIG. 8A—i.e., a set of objects that are visible to the camera 801. Based on the arrangement of the objects in FIG. 8A and the position (e.g., viewing perspective) of the camera 801, both object 803 and object 804 are at least partially visible, but object 805 is not because it is entirely occluded by the objects 803 and 804.

As discussed above with respect to block 512 of FIG. 5 and block 712 of FIG. 7, the rendering engine will render the visible objects as an array of pixels to a render buffer (e.g., the render buffer 418), where each pixel in the render buffer has a respective color. An example illustration of this type of rendering to the render buffer can be seen in FIG. 8B. From the viewing perspective of the camera 801, the object 803 is shown by a grouping of light gray colored pixels. Further, the corner edges of the object 804 that are visible from behind the object 803 are shown by several groupings of dark gray colored pixels. In this regard, the portions of the object 804 that are obscured by the object 803 are not shown—more specifically, those pixels are colored light gray, rather than dark gray, because the object 803 is closer to the camera than the object 804. Finally, because the object 805 is behind and entirely occluded by both of the objects 803 and 804, from the viewing perspective of the camera 801, no part of the example rendering shown in FIG. 8B includes black-colored pixels that correspond to the object 805.

It will be appreciated that the example illustration of the render buffer shown in FIG. 8B approximates what would be displayed (e.g., via a graphical user interface of an end-user device) if a user were to adjust the viewing perspective within the 3D model shown in FIG. 8A to a viewing perspective matching the position of the camera 801. However, although the render buffer contains a color value for each pixel that facilitates creating the 3D views discussed herein, this color-to-pixel mapping within the render buffer does not store or otherwise keep track of object identifiers for each individual object. For instance, because the view of object 804 is broken by the object 803, object 804 appears in FIG. 8B as three different groupings of dark gray colored pixels, which a user may appreciate as corresponding to the same object 804. But the render buffer itself does not contain any information to indicate whether these similarly colored groupings of pixels belong to the same object or different, similarly-colored objects (e.g., other dark gray-colored objects).

Accordingly, and as discussed above with respect to block 514 of FIG. 5 and block 702 of FIG. 7, the computing platform may also render the visible objects as an array of pixels to an object cache buffer (e.g., the object cache buffer 416). However, instead of assigning a color to each pixel, the computing platform may assign each pixel an object identifier for the visible object that the object identifier represents. An example illustration of this type of rendering to the object cache buffer can be seen in FIG. 8C, which shows the same arrangement as shown in FIG. 8B. However, instead of being assigned a color, each pixel is assigned the object ID corresponding to the object that is visible to the camera 801. In particular, rather than light gray-colored pixels, the object 803 is represented by pixels having an object identifier of "A1." Further, rather than dark gray-colored pixels, the object 804 is represented by three groupings of pixels each having an object identifier of "B1."

In this regard, the example illustration of the object cache buffer shown in FIG. 8C may not be as not as useful as the render buffer for visualization purposes, and thus the contents of the object cache buffer would not be displayed as such (e.g., via a GUI) to a user. Rather, the computing platform may use the information in the object cache buffer to determine whether any new object identifiers are included in the object cache buffer (and in accordance with the first embodiment described above, thereby determine whether any new object has been rendered to the render buffer). If any new object identifiers are found, they may be added to an object cache (e.g., the object ID cache 420).

The computing platform may determine whether any new object identifiers are included in the object cache buffer in various ways. For instance, the computing platform may initially perform one or more operations to unique the object identifiers in the object cache buffer, as there are likely to be numerous pixels having the same object identifier, perhaps across several different groupings of pixels, as shown in FIG. 8C. Once a unique list of object identifiers included in the object cache buffer is determined, the computing platform may compare the list to the set of object identifiers in the object cache to determine whether any new object identifiers are included. In line with the discussion above with respect to the second embodiment disclosed herein, the computing platform may perform these one or more operations any number of times during initialization of the 3D model. The computing platform may determine whether any new object identifiers are included in the object cache buffer in other ways as well.

Figure 9A:
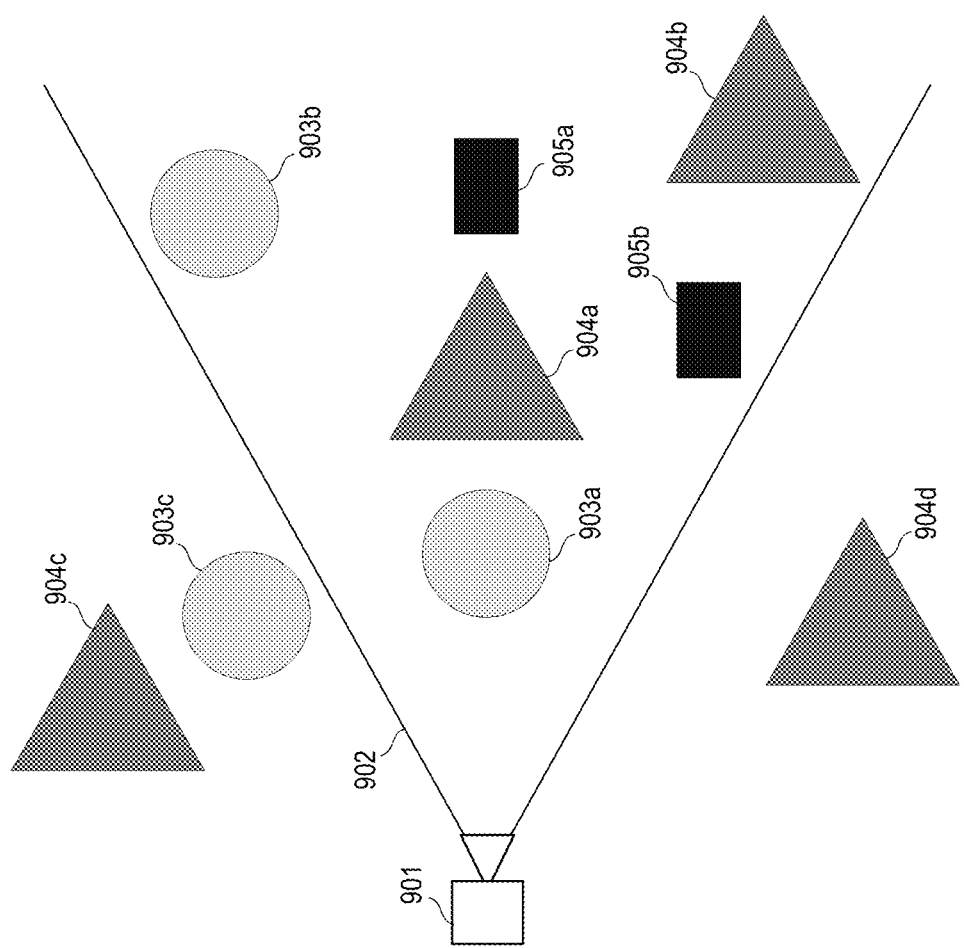
FIG. 9A depicts a schematic example of first view frustum within a 3D model and an example set of objects that may be viewable within the first view frustum.
Figure 9B:
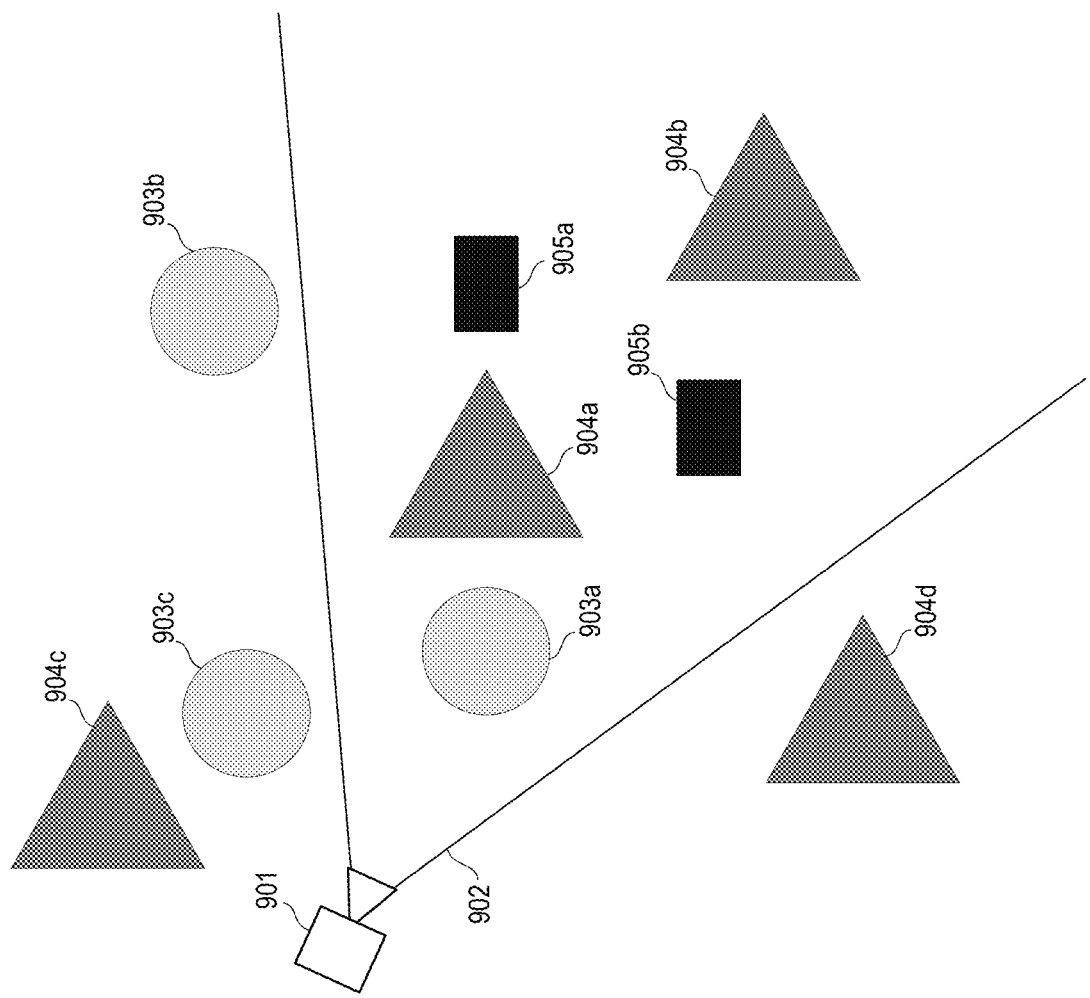
FIG. 9B depicts a schematic example of second view frustum within a 3D model and an example set of objects that may be viewable within the second view frustum.
Figure 9C:
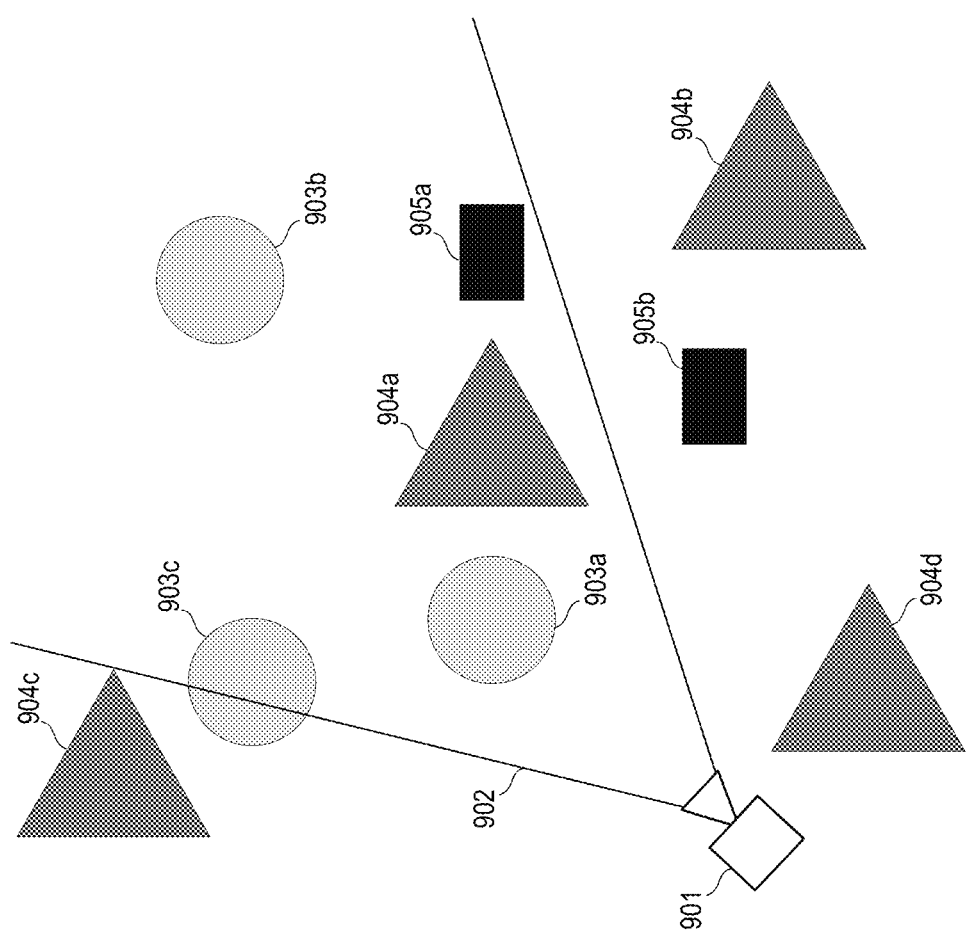
FIG. 9C depicts a schematic example of third view frustum within a 3D model and an example set of objects that may be viewable within the third view frustum.

Turning now to FIGS. 9A-9C, simplified examples are depicted that serve to illustrate example view frustums and objects within those view frustums that may be rendered to a render buffer and/or an object cache buffer based on their visibility from a given viewing perspective.

With reference first to FIG. 9A, an example set of objects is shown, including light gray objects 903a, 903b, and 903c, dark gray objects 904a, 904b, 904c, and 904d, and black objects 905a and 905b, each of which may represent a respective object within a 3D model for a given construction project. In accordance with the second embodiment discussed above, some or all of these objects may have been identified during an initialization stage, such that object identifiers for each identified object were added to the object ID cache 420. Those identified objects may then serve as the initial set of objects 406 for each of the examples discussed below. A viewing perspective is represented by a camera 901 having a conical view frustum 902.

In line with the discussion above, a rendering engine of a computing platform, such as the rendering engine 402 of the computing platform 400 shown in FIG. 4 and FIG. 6, may perform one or more operations to identify a set of objects that are visible from the viewing perspective shown in FIG. 9A—i.e., a set of objects that are visible to the camera 901. For instance, based on performing view frustum processing as described above, the rendering engine may determine that six objects are present within the view frustum 902—i.e., objects 903a, 903b, 904a, 904b, 905a, and 905b. Further, based on performing occlusion culling as described above, the rendering engine may determine that at least some portion of five of those six objects is visible from the position (e.g., viewing perspective) of the camera 901—i.e., objects 903a (completely visible), 903b (partially visible), 904a (partially visible), 904b (partially visible), and 905b (partially visible)—and that one of those six objects, 905a, is completely occluded (e.g., not visible). Therefore, in line with the discussion above, the computing platform may determine the five visible objects 903a, 903b, 904a, 904b, and 905b as the set of final objects 410 that are to be rendered and may then render those objects to a render buffer as colored pixels.

In accordance with the first embodiment, the computing platform may also render the final set of objects to an object cache buffer as pixels having respective object identifiers. Further, the computing platform 400 may cause the respective object identifiers of the five visible objects 903a, 903b, 904a, 904b, and 905b to be stored in the object ID cache 420. In such an embodiment, the occluded object 905a may not be rendered to either buffer, and thus an object identifier corresponding to the object 905a would not be added to the object ID cache 420.

On the other hand, in accordance with the second embodiment, the object 904a may not have been identified during the initialization stage (e.g., it may have been obscured by other objects in each of the initialization viewing perspectives). Consequently, an object identifier corresponding to the object 904a may not be included in the object ID cache 420, and may not be added to the object ID cache 420 when it is rendered in the example of FIG. 9A. Further, although the occluded object 905a may not be rendered to the render buffer for display at the end-user device in the example shown in FIG. 9A, an object identifier corresponding to the object 905a may have been added to the object ID cache 420 during initialization of the 3D model of the construction project. Thus, if the viewing perspective of the camera 901 were to be adjusted such that the object 905a becomes partially or entirely visible (see below), the object 905a may be rendered in the new frame based on its respective object identifier being retrieved from the object ID cache 420.

FIG. 9B depicts the example set of objects of FIG. 9A in an instance where the viewing perspective of the camera 901 has shifted, thereby defining an updated view frustum 902. In line with the first embodiment discussed above, the objects that were rendered, and whose object identifiers were cached in the example of FIG. 9A, may serve as at least part of the initial set of objects 406 for the example shown in FIG. 9B. Alternatively, according to the second embodiment, all of the same objects in the object ID cache 420 may form the initial set of objects 406—not including the object 904a, as noted above. As shown in FIG. 9B, after performing view frustum processing, the rendering engine may determine that only five objects are now within the view frustum 902—i.e., 903a, 904a, 904b, 905a, and 905b. Further, after performing occlusion culling, the rendering engine may determine that only objects 903a and 904a are visible within the view frustum 902. In line with the discussion above, the computing platform may determine the two visible objects 903a and 904a as the set of final objects 410 that are to be rendered and may then render those objects to the render buffer as colored pixels and to the object cache buffer as object identifiers. Further, in accordance with the first embodiment, the computing platform 400 may compare the object identifiers for the objects 903a and 904a to the object identifiers in the object ID cache 420 to determine whether or not they have already been cached. As those two object identifiers were previously cached in the example of 9A, the computing platform 400 may determine that no new object identifiers need to be cached.

FIG. 9C depicts the example set of objects shown in FIGS. 9A and 9B in an instance where the viewing perspective of the camera 901 has shifted further, thereby defining a further updated view frustum 902. In line with the discussion above, and in accordance with the first embodiment, the objects represented by the object identifiers that were cached in the examples of FIGS. 9A and 9B may serve as at least part of the initial set of objects 406 for the example shown in FIG. 9C. Alternatively, according to the second embodiment, all of the same objects in the object ID cache 420 may form the initial set of objects 406, as noted above. As shown in FIG. 9C, after performing view frustum processing, the rendering engine may determine that a different set of five objects—i.e., 903a, 903b, 903c, 904a, and 905a—are now within the view frustum 902. Further, after performing occlusion culling, the rendering engine may determine that four of those objects—i.e., 903a, 903c, 904a, and 905a—are visible within the view frustum 902. Notably, the objects 903c and 905a, which were not visible in either example of FIG. 9A or 9B, are now visible in the example of FIG. 9C.

In line with the discussion above, the computing platform may determine the four visible objects 903a, 903c, 904a, and 905a as the set of final objects 410 that are to be rendered and may then render those objects to the render buffer as colored pixels and to the object cache buffer as object identifiers. Further, in accordance with the first embodiment, the computing platform 400 may compare the object identifiers for the objects 903a, 903c, 904a, and 905a to the object identifiers in the object ID cache 420 to determine whether or not they have been cached. The computing platform 400 may determine that the object identifiers for newly visible objects 903c and 905a have not been cached and may cause those object identifiers to be cached in the object ID cache 420. Alternatively, as noted above, in accordance with the second embodiment, one or both of the objects 903c and 905a may have been identified during the initialization stage, and thus both objects may have been included in the object ID cache 420, and the initial set of objects 406 in the example of FIG. 9C.

IV. CONCLUSION

Example embodiments of the disclosed innovations have been described above. Those skilled in the art will understand, however, that changes and modifications may be made to the embodiments described without departing from the true scope and spirit of the present invention, which will be defined by the claims.

Further, to the extent that examples described herein involve operations performed or initiated by actors, such as "humans," "operators," "users," or other entities, this is for purposes of example and explanation only. Claims should not be construed as requiring action by such actors unless explicitly recited in claim language.

The invention claimed is:

1. A computing platform comprising:
at least one processor;
at least one non-transitory computer-readable medium; and
program instructions stored on the at least one non-transitory computer-readable medium that are executable by the at least one processor such that the computing platform is configured to:
  initialize a three-dimensional (3D) model of a given construction project and thereby determine a first set of objects within the 3D model;
  receive, from an end-user device, an indication of a command to display a first frame of the 3D model from a first viewpoint having a first view frustum;
  identify at least a subset of objects from the first set that are contained within the first view frustum;
  apply one or more object processing techniques and thereby identify one or more additional objects that are contained within the first view frustum;
  render to a render buffer, as an array of pixels, a second set of objects that are to be displayed in the first frame, the second set of objects comprising (i) the subset of objects from the first set and (ii) the one or more additional objects that are contained within the first view frustum;
  based on the second set of objects, cause the first frame of the 3D model of the given construction project to be displayed at the end-user device from the first viewpoint;
  receive, from the end-user device, an indication of a command to display a second frame of the 3D model from a second viewpoint having a second view frustum;
  based on the indication of the command to display the second frame, identify at least a second subset of objects from the first set that are contained within the second view frustum;
  apply one or more object processing techniques and thereby identify one or more additional objects that are contained within the second view frustum;
  render to a render buffer, as an array of pixels, a third set of objects that are to be displayed in the second frame, the third set of objects comprising (i) the second subset of objects from the first set and (ii) the one or more additional objects that are contained within the second view frustum; and
  based on the third set of objects, cause the second frame of the 3D model of the construction project to be displayed at the end-user device from the second viewpoint.

2. The computing platform of claim 1, wherein:
the program instructions that are executable by the at least one processor such that the computing platform is configured to initialize the 3D model of the given construction project and thereby determine the first set of objects within the 3D model comprise program instructions that are executable by the at least one processor such that the computing platform is configured to:
  identify a plurality of initialization viewpoints of the 3D model;
  for each initialization viewpoint, render to an object cache buffer, as a respective pixel array, a respective set of objects visible from that initialization viewpoint, wherein each pixel has a respective object identifier; and cause each unique object identifier to be stored in an object identifier cache; and the respective sets of objects collectively form the first set of objects.

3. The computing platform of claim 1, wherein the one or more object processing techniques include one or more of (i) view frustum processing, (ii) object occlusion culling, or (iii) back-face culling.

4. The computing platform of claim 1, wherein the second set of objects comprises objects that are visible from the first viewpoint, and wherein the third set of objects comprises objects that are visible from the second viewpoint.

5. The computing platform of claim 1, wherein the program instructions that are executable by the at least one processor such that the computing platform is configured to determine the second set of objects comprise program instructions that are executable by the at least one processor such that the computing platform is configured to:

for each pixel to be rendered to the render buffer, determine a respective object identifier.

6. The computing platform of claim 1, further comprising program instructions stored on the non-transitory computer-readable medium that are executable by the at least one processor such that the computing platform is configured to:

at a rate of at least 20 frames per second, continuously render the second and third sets of objects to the render buffer and thereby cause respective frames of the 3D model to be displayed at the end-user device.

7. The computing platform of claim 1, wherein the program instructions that are executable by the at least one processor such that the computing platform is configured to cause the second frame of the 3D model of the construction project to be displayed at the end-user device from the second viewpoint comprise program instructions that are executable by the at least one processor such that the computing platform is configured to:

cause the second frame of the 3D model to be displayed via a graphical user interface (GUI) of the end-user device.

8. The computing platform of claim 1, wherein the command to display the second frame of the 3D model from the second viewpoint is a command to update the first viewpoint and comprises at least one of: a pan command, a zoom command, or a rotate command.

9. The computing platform of claim 1, wherein the one or more additional objects that are contained within the second view frustum comprise at least one object that was not contained within the first view frustum.

10. At least one non-transitory computer-readable medium, wherein the at least one non-transitory computer-readable medium is provisioned with program instructions that, when executed by at least one processor, cause a computing platform to:

initialize a three-dimensional (3D) model of a given construction project and thereby determine a first set of objects within the 3D model;

receive, from an end-user device, an indication of a command to display a first frame of the 3D model from a first viewpoint having a first view frustum;

identify at least a subset of objects from the first set that are contained within the first view frustum;

apply one or more object processing techniques and thereby identify one or more additional objects that are contained within the first view frustum;

render to a render buffer, as an array of pixels, a second set of objects that are to be displayed in the first frame, the second set of objects comprising (i) the subset of objects from the first set and (ii) the one or more additional objects that are contained within the first view frustum;

based on the second set of objects, cause the first frame of the 3D model of the given construction project to be displayed at the end-user device from the first viewpoint;

receive, from the end-user device, an indication of a command to display a second frame of the 3D model from a second viewpoint having a second view frustum;

based on the indication of the command to display the second frame, identify at least a second subset of objects from the first set that are contained within the second view frustum;

apply one or more object processing techniques and thereby identify one or more additional objects that are contained within the second view frustum;

render to a render buffer, as an array of pixels, a third set of objects that are to be displayed in the second frame, the third set of objects comprising (i) the second subset of objects from the first set and (ii) the one or more additional objects that are contained within the second view frustum; and based on the third set of objects, cause the second frame of the 3D model of the construction project to be displayed at the end-user device from the second viewpoint.

11. The at least one non-transitory computer-readable medium of claim 10, wherein:

the program instructions that, when executed by at least one processor, cause the computing platform to initialize the 3D model of the given construction project and thereby determine the first set of objects within the 3D model comprise program instructions that, when executed by at least one processor, cause the computing platform to:

identify a plurality of initialization viewpoints of the 3D model;

for each initialization viewpoint, render to an object cache buffer, as a respective pixel array, a respective set of objects visible from that initialization viewpoint, wherein each pixel has a respective object identifier; and cause each unique object identifier to be stored in an object identifier cache; and the respective sets of objects collectively form the first set of objects.

12. The at least one non-transitory computer-readable medium of claim 10, wherein the one or more object processing techniques include one or more of (i) view frustum processing, (ii) object occlusion culling, or (iii) back-face culling.

13. The at least one non-transitory computer-readable medium of claim 10, wherein the second set of objects comprises objects that are visible from the first viewpoint, and wherein the third set of objects comprises objects that are visible from the second viewpoint.

14. The at least one non-transitory computer-readable medium of claim 10, wherein the program instructions that, when executed by at least one processor, cause the computing platform to determine the second set of objects comprise program instructions that, when executed by at least one processor, cause the computing platform to:

for each pixel to be rendered to the render buffer, determine a respective object identifier.

15. The at least one non-transitory computer-readable medium of claim 10, wherein the at least one non-transitory computer-readable medium is also provisioned with program instructions that, when executed by at least one processor, cause the computing platform to:
at a rate of at least 20 frames per second, continuously render the second and third sets of objects to the render buffer and thereby cause respective frames of the 3D model to be displayed at the end-user device.

16. The at least one non-transitory computer-readable medium of claim 10, wherein the one or more additional objects that are contained within the second view frustum comprise at least one object that was not contained within the first view frustum.

17. A method carried out by a computing platform, the method comprising:
initializing a three-dimensional (3D) model of a given construction project and thereby determining a first set of objects within the 3D model;
receiving, from an end-user device, an indication of a command to display a first frame of the 3D model from a first viewpoint having a first view frustum;
identifying at least a subset of objects from the first set that are contained within the first view frustum;
applying one or more object processing techniques and thereby identifying one or more additional objects that are contained within the first view frustum;
rendering to a render buffer, as an array of pixels, a second set of objects that are to be displayed in the first frame, the second set of objects comprising (i) the subset of objects from the first set and (ii) the one or more additional objects that are contained within the first view frustum;
based on the second set of objects, causing the first frame of the 3D model of the given construction project to be displayed at the end-user device from the first viewpoint;
receiving, from the end-user device, an indication of a command to display a second frame of the 3D model from a second viewpoint having a second view frustum;
based on the indication of the command to display the second frame, identifying at least a second subset of objects from the first set that are contained within the second view frustum;
applying one or more object processing techniques and thereby identifying one or more additional objects that are contained within the second view frustum;
rendering to a render buffer, as an array of pixels, a third set of objects that are to be displayed in the second frame, the third set of objects comprising (i) the second subset of objects from the first set and (ii) the one or more additional objects that are contained within the second view; and
based on the third set of objects, causing the second frame of the 3D model of the construction project to be displayed at the end-user device from the second viewpoint.

18. The method of claim 17, wherein:
initializing the 3D model of the given construction project and thereby determining the first set of objects within the 3D model comprises:
identifying a plurality of initialization viewpoints of the 3D model;
for each initialization viewpoint, rendering to an object cache buffer, as a respective pixel array, a respective set of objects visible from that initialization viewpoint, wherein each pixel has a respective object identifier; and
causing each unique object identifier to be stored in an object identifier cache; and
the respective sets of objects collectively form the first set of objects.

19. The method of claim 17, wherein the one or more object processing techniques include one or more of (i) view frustum processing, (ii) object occlusion culling, or (iii) back-face culling.

20. The method of claim 17, wherein the third set of objects comprises objects that are visible from the second viewpoint.

* * * * *